US006238839B1

(12) United States Patent
Tomita et al.

(10) Patent No.: US 6,238,839 B1
(45) Date of Patent: May 29, 2001

(54) LITHOGRAPHIC PRINTING PLATE PRECURSOR

(75) Inventors: Tadabumi Tomita; Hisashi Hotta; Akio Uesugi, all of Shizuoka (JP)

(73) Assignee: Fuji Photo Film Co., Ltd., Minami-Ashigara-Kanagawa (JP)

( * ) Notice: Subject to any disclaimer, the term of this patent is extended or adjusted under 35 U.S.C. 154(b) by 0 days.

(21) Appl. No.: 09/642,836

(22) Filed: Aug. 22, 2000

(30) Foreign Application Priority Data

Aug. 26, 1999 (JP) ........................................ 11-240601
Nov. 11, 1999 (JP) ........................................ 11-321349

(51) Int. Cl.$^7$ ........................ G03F 7/11; B41N 1/08

(52) U.S. Cl. ........................ 430/278.1; 430/275.1; 430/525; 430/166; 430/160; 430/944; 430/945; 101/457; 101/458; 101/459

(58) Field of Search ........................ 430/278.1, 275.1, 430/525, 166, 160; 101/457, 458, 459

(56) References Cited

U.S. PATENT DOCUMENTS

| | | | | |
|---|---|---|---|---|
| 3,865,595 | | 2/1975 | Watkinson | 96/33 |
| 5,188,032 | | 2/1993 | Lewis et al. | 101/453 |
| 5,570,636 | * | 11/1996 | Lewis | 101/457 |
| 5,632,204 | | 5/1997 | Lewis | 101/453 |
| 6,071,674 | * | 6/2000 | Hattori | 430/278.1 |
| 6,096,476 | * | 8/2000 | Yanagida et al. | 430/271.1 |

FOREIGN PATENT DOCUMENTS

| | | | |
|---|---|---|---|
| EP0802067 | | 10/1997 | (EP) . |
| 0 941 841 A2 | * | 9/1999 | (EP) . |
| 3-22828 | | 3/1991 | (JP) . |
| 3-27811 | | 4/1991 | (JP) . |
| 5-77573 | | 3/1993 | (JP) . |
| 11-291654 | * | 10/1999 | (JP) . |

OTHER PUBLICATIONS

Tabata et al, Pub–No. JP411291654A, English abstract of JP 11–291654 A, Japanese patent abstracts, JPO, 1999, one page obtained from online West database in USPTO.*

* cited by examiner

*Primary Examiner*—Cynthia Hamilton
(74) *Attorney, Agent, or Firm*—Burns, Doane, Swecker & Mathis, LLP

(57) ABSTRACT

A lithographic printing plate precursor which comprises a metal support having provided thereon a heat-insulating layer, a metal layer having a hydrophilic surface, and a lipophilic layer which is abraded by heating or whose solubility to alkali is transformed by heating, in this order from the support.

4 Claims, 4 Drawing Sheets

LITHOGRAPHIC PRINTING PLATE PRECURSOR

FIELD OF THE INVENTION

The present invention relates to a lithographic printing plate precursor, in particular, relates to a lithographic printing plate precursor capable of plate-making by scanning exposure based on digital signals, having high sensitivity, high press life and high strength, and capable of providing printed matters with no staining.

BACKGROUND OF THE INVENTION

A lithographic printing plate precursor capable of forming an image by a heat source such as a heat-sensitive head, etc., and a lithographic printing plate precursor capable of forming an image by heat which is converted from irradiated light, are known in the lithographic printing technique. In particular, the latter lithographic printing plate precursor is promising as the lithographic printing plate precursor for computer to plate (CTP) technique capable of directly making a printing plate without necessitating a film by scanning highly directional active radiant rays such as laser rays in accordance with digitized image data.

As the support of a lithographic printing plate precursor capable of forming an image by the work of heat (called heat-sensitive type image recording), metals such as aluminum and polyethylene terephthalate (PET) are widely used.

When metals are used as the support of a lithographic printing plate precursor, since metals do not absorb water and a solvent, moreover, are excellent in strength, even if water and a solvent is used after that in a developing step, dimensional accuracy of the support does not deteriorate and the recorded image is correctly reproduced. Further, since metals are fundamentally excellent in strength, the obtained lithographic printing plate precursors have excellent press life in many cases.

However, since metals have a high heat-conductivity, even if it is tried to form an image by irradiation of light for image-recording, e.g., laser rays, and converting the light to heat, the heat is liable to be dissipated to a metal support and a satisfactory image is difficult to be formed. That is, the sensitivity of the lithographic printing plate precursor becomes very low, and staining due to ink is generated on the non-image area of a printed matter. Therefore, sufficient energy becomes necessary to form an image, for instance, by raising light output and delaying writing time, but if light output is increased, the manufacturing cost of a writing unit increases, as a result, the advantage of the manufacturers of the unit is lowered, and if writing time is delayed, plate-making takes longer time, as a result, the advantage of the printing press is lowered.

On the other hand, when PET is used as the support of a lithographic printing plate precursor, it has been known that since PET is comparatively low in heat conductivity as compared with metals, PET is very advantageous in the point of the minimum energy necessary for writing an image, i.e., sensitivity.

However, since PET absorbs water, although as small as 0.4% or so, when water and a solvent are used at printing, a support absorbs water and the dimension of a printing plate extends in some cases. Accordingly, in particular in four color printing, images are not be correctly reproduced (image disorder occurs) and in many cases unmarketable. There is another drawback that PET is lower in strength as compared with metals, hence the press life is inferior.

For the purpose of aiming at solving the above problem, a technique of providing a heat-insulating layer on the metal surface of the support of a lithographic printing plate precursor, and a hydrophilic hardening layer thereon is disclosed in WO 96/507727. However, the compatibility of sensitivity with press life could not be solved even by this technique.

SUMMARY OF THE INVENTION

Accordingly, an object of the present invention is to provide a lithographic printing plate precursor having high sensitivity and capable of obtaining printed matters of clear images having no staining in heat-sensitive type image-recording.

As a result of earnest investigation, the present inventors have found that an image can be formed by newly providing a heat-insulating layer of a specific material having low heat conductivity between metal layers and an image-recording layer as the uppermost layer on a lithographic printing plate precursor, and irradiating the printing plate precursor with light of low output from the uppermost layer side. That is, the lithographic printing plate precursor according to the present invention comprises a metal support having provided thereon a heat-insulating layer, a metal layer having a hydrophilic surface, and a lipophilic layer which is abraded (i.e., fused and removed) by heating or whose solubility to alkali is transformed by heating, in this order from the support. By this constitution of the lithographic printing plate precursor of the present invention, the heat given in the lipophilic layer for forming an image is difficult to be dissipated to the outside of the lipophilic layer due to the insulating effect of the heat-insulating layer, as a result, the heat can be used effectively for forming an image and sensitivity is improved. Further, the recorded image can be correctly reproduced due to high dimensional stability of the metal support even if water or a solvent is used in a developing step, and press life can be improved due to the high strength of the metal support as well. In addition, as a metal layer having a hydrophilic surface is provided on the lithographic printing plate precursor of the present invention, surface roughness, surface shape, and adsorption surface area can be freely controlled by conventionally well-known surface treating techniques such as mechanical abrasion, anodic oxidation and electrochemical etching, thus the above object of the present invention has been accomplished without selecting specific material of the image-recording layer.

Figure 1:
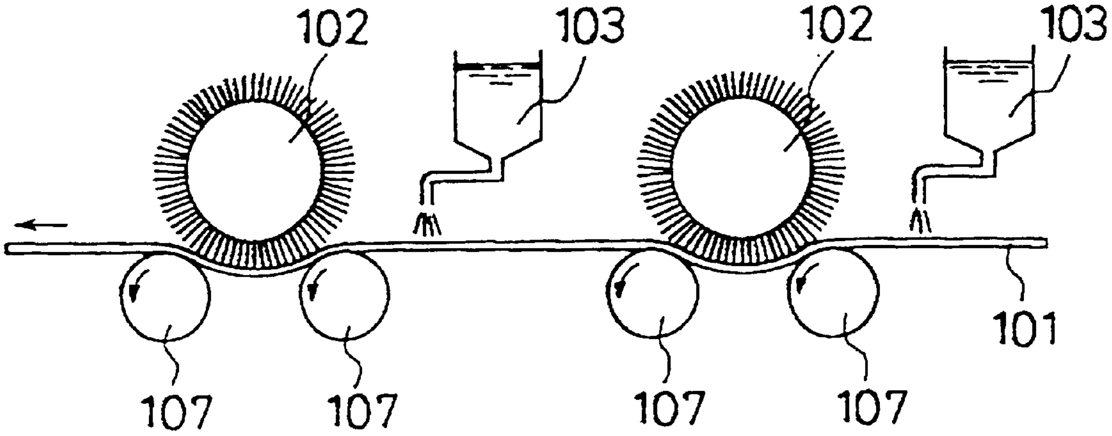
FIG. 1 is a schematic view showing one example of surface-roughening step using a brush which is used in mechanical surface-roughening treatment of the metal layer surface of a metal layer-laminated support.

Key to the Symbols
101: Metal layer-laminated support
102: Brush in roll
103: Abrasive slurry
201: Nip roll
202: Passing roll
203: Spray
204: Solution-feeding pump
205: Solution-preparing tank
211: Etching treating tank
222: Metal layer-laminated support
301: Metal layer-laminated support
302: First front surface-roughening unit
303: Second front surface-roughening unit
304: Back surface-roughening unit
306: Main electrode
307: Drum roll
308: Electrolyte (i.e., Elecrtolytic solution)
309: Passing roll
410: Anodic oxidation treating unit
412: Electric power supplying tank
414: Electrolytic treating tank
416: Metal layer-laminated support
418, 426: Electrolyte (i.e., Elecrtolytic solution)
430: Electrode for electrolysis

DETAILED DESCRIPTION OF THE INVENTION

The present invention will be described in detail blow.

(a) Heat-Insulating Layer

In the first place, a heat-insulating layer provided on the lithographic printing plate precursor according to the present invention will be described.

A heat-insulating layer preferably has a heat conductivity of preferably 40 W/(m·K) or less, more preferably from 0.0025 to 0.4 W/(m·K), and particularly preferably from 0.0025 to 0.1 W/(m·K)

A heat conductivity can be obtained by a stationary heating method, a periodic heating method, a pulse heating method (inclusive of a laser flash method), a step heating method, a square wave pulse heating method, and a Laplace transformation method, preferably heat conductivity at 300° K can be obtained by a stationary heating method described in JIS A-1412, e.g., by a commercially available heat conductivity measuring apparatus. Further, an analytical curve method which comprises preparing analytical curves of four standard samples of Al having heat conductivity of 237 W/(m·k) and purity of 99.9%, austenitic stainless steel (SUS304, 18Cr—8Ni) having heat conductivity of 16.0 W/(m·k), quartz glass having heat conductivity of 1.38 W/(m·k) and acrylic resin having heat conductivity of 0.21 W/(m·k), and compensating for or calculating heat conductivity can be preferably used.

Further, as described later, when a liquid substance or a semi-liquid substance such as an adhesive is used alone as a heat-insulating layer, the heat conductivity of such a substance can be obtained by solidifying the substance by drying or reaction and measuring the heat conductivity of the solidified product at 300° K.

Specific examples of resins preferably used as a heat-insulating layer in the present invention include EAA (ethylene/acrylic resin), EMAA (ethylene/methacrylic resin), ionomer, LDPE (low density polyethylene), LLDPE (linear low density polyethylene), HDPE (high density polyethylene), styrene resins and styrene copolymer resins such as polystyrene (PSt), and poly-a-methylstyrene, polyvinyl chloride (PVC), polyvinylidene chloride (PVdC), polyester, polyurethane, polyacrylates and polyvinyl formal, polyvinyl butyral, cellulose derivatives such as ethyl cellulose, hydroxyethyl cellulose, cellulose acetate, and cellulose acetate propionate, acrylic resins or methacrylic resins such as ethyl polymethacrylate and butyl polymethacrylate, rosin ester resins such as rosin, rosin modified maleic resin, and polymerized rosin, polypropylene (PP), polyethylene terephthalate (PET), and polyethylene (PE). Of these, EAA (ethylene/acrylic resin), EMAA (ethylene/methacrylic resin), ionomer, LDPE (low density polyethylene), LLDPE (linear low density polyethylene), and HDPE (high density polyethylene) are preferred due to their excellent adhering property with metals.

Other resins which can be used as a heat-insulating layer in the present invention include novolak resins, e.g., phenol/formaldehyde resin, m-cresol/formaldehyde resin, p-cresol/formaldehyde resin, m-/p-mixed cresol/formaldehyde resin, and phenol/cresol (m-, p-, o- or any of m-/p-/o-mixtures) mixed formaldehyde resin. These resins preferably have a weight average molecular weight of from 500 to 100,000.

In addition, resol type phenol resins are also preferably used, e.g., phenol/cresol (m-, p-, o- or any of m-/p-/o-mixtures) mixed formaldehyde resins are preferably used. Phenol resins disclosed in JP-A-61-217034 (the term "JP-A" as used herein means an "unexamined published Japanese patent application") are preferably used.

Moreover, various high molecular compounds can be used as a heat-insulating layer such as phenol-modified xylene resins, polyhydroxystyrene, hydroxystyrene polyhalide, acrylic resins having a phenolic hydroxyl group as disclosed in JP-A-51-34711, vinyl resins and urethane resins having a sulfonamido group disclosed in JP-A-2-866, vinyl resins having the structural unit as disclosed in JP-A-7-28244, JP-A-7-36184, JP-A-7-36185, JP-A-7-248628, JP-A-7-261394, and JP-A-7-333839. In particular in vinyl resins, film-forming resins having at least one monomer selected from the following monomers (1) to (4) as a polymer component are preferably used.

(1) N-(4-Hydroxyphenyl)acrylamide or N-(4-hydroxyphenyl) methacrylamide, acrylamides, methacrylamides, acrylates, methacrylates and hydroxystyrenes having an aromatic hydroxyl group such as o-, m- or p-hydroxystyrene, o- or m-bromo-p-hydroxystyrene, o- or m-chloro-p-hydroxystyrene, o-, m- or p-hydroxyphenyl acrylate or methacrylate.

(2) Unsaturated carboxylic acids such as acrylic acid, methacrylic acid, maleic acid, maleic anhydride and half esters thereof, itaconic acid, itaconic anhydride and half esters thereof.

(3) Acrylamides such as N-(o-aminosulfonylphenyl) acrylamide, N-(m-aminosulfonylphenyl)acrylamide, N-(p-aminosulfonylphenyl)acrylamide, N-[1-(3-aminosulfonyl)naphthyl]acrylamide, and N-(2-aminosulfonylethyl)acrylamide, methacrylamides such as N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide, and N-(2-aminosulfonylethyl)methacrylamide, unsaturated sulfonamides such as acrylates, e.g., o-aminosulfonylphenyl acrylate, m-aminosulfonylphenyl acrylate, p-aminosulfonylphenyl acrylate, and 1-(3-aminosulfonylphenylnaphthyl)acrylate, and unsaturated sulfonamides such as methacrylates, e.g., o-aminosulfonylphenyl methacrylate, m-aminosulfonylphenyl methacrylate, p-aminosulfonylphenyl methacrylate, and 1-(3-aminosulfonylphenylnaphthyl) methacrylate.

(4) Phenylsulfonylacrylamide which may have a substituent such as tosylacrylamide and phenylsulfonylmethacrylamide which may have a substituent such as tosylmethacrylamide.

In addition, film-forming resins copolymerized with any of the following monomers (5) to (14) are also preferably used.

(5) Acrylates and methacrylates having an aliphatic hydroxyl group, e.g., 2-hydroxyethyl acrylate and 2-hydroxyethyl methacrylate.

(6) (Substituted) acrylates such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, and N-dimethylaminoethyl acrylate.

(7) (Substituted) methacrylates such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, and N-dimethylaminoethyl methacrylate.

(8) Acrylamide or methacrylamide such as acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide, and N-ethyl-N-phenylmethacrylamide.

(9) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(10) Vinyl esters such as vinyl acetate, vinyl chloroacetate, vinyl butyrate, and vinyl benzoate.

(11) Styrenes such as styrene, α-methylstyrene, methylstyrene, and chloromethylstyrene.

(12) Vinyl ketones such as methyl vinyl ketone, ethyl vinyl ketone, propyl vinyl ketone, and phenyl vinyl ketone.

(13) Olefins such as ethylene, propylene, isobutylene, butadiene, and isoprene.

(14) N-Vinylpyrrolidone, N-vinylcarbazole, 4-vinylpyridine, acrylonitrile, and methacrylonitrile.

These high molecular compounds preferably have a weight average molecular weight of from 500 to 500,000, and these high molecular compounds may be used alone or in combination of two or more.

Further, as disclosed in U.S. Pat. No. 4,123,279, condensation products of phenols having an alkyl group having from 3 to 8 carbon atoms as the substituent with formaldehyde, e.g., t-butylphenol-formaldehyde resins and octylphenol-formaldehyde resins, or o-naphthoquinonediazide sulfonates thereof (e.g., disclosed in JP-A-61-243446) may be used in combination in a heat-insulating layer.

A heat-insulation layer may contain fluorine-based surfactants such as those disclosed in JP-A-62-170950 for the purpose of improving a coating property. These surfactants are preferably added in an amount of from 0.01 to 1 wt %, more preferably from 0.05 to 0.5 wt %, based on the entire composition of the heat-insulating layer.

A heat-insulating layer is provided on a metal support described later. A heat-insulating layer maybe directly adhered alone to a metal support by heat fused adhesion (i.e., hot-melt-adhesion), co-extrusion lamination, etc., or may be adhered to a metal support using various adhesives as described below.

Specific examples of various adhesives include an aromatic polyether-based one pack-type moisture hardening type adhesive (trade name: SF102RA (manufactured by Dainippon Chemicals and Ink Co., Ltd.)), an aromatic polyether-based two pack-type hardening type adhesive (trade name: 2K-SF-302A/HA550B (manufactured by Dainippon Chemicals and Ink Co., Ltd.)), an aliphatic polyester-based two pack-type hardening type adhesive (trade name: 2K-SF-250A/HA280B (manufactured by Dainippon Chemicals and Ink Co., Ltd.)), an aqueous adhesive for dry lamination (trade name: WS305A/LB-60, WS201A/LB-60, WS325A/LJ-55, WS350A/LA-100, and WS-320A (manufactured by Dainippon Chemicals and Ink Co., Ltd.)), an organic solvent type adhesive for dry lamination (trade name: LX-747A/KX-75, LX-88H(T)/KW-75, LX-732/KRX-90 (manufactured by Dainippon Chemicals and Ink Co., Ltd.)), an epoxy-based one pack-type thermal hardening type adhesive (trade name: EP106, EP138, EP160, EP170, EP171 (manufactured by Cemedain Co., Ltd.)), a one pack-type anaerobic hardening type adhesive such as acryl-based oligomer (SGA) (trade name: Y-800 series, Y-805GH (manufactured by Cemedain Co., Ltd.)), a specific silicone-modified polymer-based one pack-type elastic adhesive (trade name: Super X (manufactured by Cemedain Co., Ltd.)), as phenol resin complex polymer-based adhesives, mixtures of phenolic resin and butadiene or acrylonitrile rubber, various mixtures of phenolic resin and polyvinyl acetate, polyvinyl acetal, polyvinyl butyral or polyvinyl formal, mixtures of phenolic resin and epoxy, a two pack-type condensation reaction type adhesive, a two pack-type addition reaction type adhesive such as epoxy, isocyanate, etc., a two pack-type radical polymerization type adhesive such as acrylic oligomer (SGA), a heat fusion type adhesive such as polyimide, polyester, polyolefin, etc., a pressure-sensitive type adhesive such as rubber, polyacrylate, etc., a one pack-type normal temperature hardening adhesive with 2-cyanoacrylate as a main component, a methyl 2-cyanoacrylate adhesive, an ethyl 2-cyanoacrylate adhesive (trade name: Aron alpha (manufactured by Toa Gosei Kagaku Co., Ltd.)), and an α-cyanoacrylate-based adhesive (trade name: 3000DX series (manufactured by Cemedain Co., Ltd.)). Adhesives good in adhering property to metals are preferred and various such adhesives can also be used alone as a heat-insulating layer.

A heat-insulating layer preferably has a thickness of from 3 to 50 μm, more preferably from 5 to 20 μm, and particularly preferably from 10 to 20 μm.

The thickness of a heat-insulating layer can be obtained, for example, by observing fractures by an SEM (a scanning electron microscope) and averaging thicknesses at ten points.

(b) Metal Layer Having Hydrophilic Surface

A metal layer having a hydrophilic surface is provided on the above heat-insulating layer, and metals and metal compounds can be used as the metal layer.

As metals, transition metals, metals such as indium, tin, antimony, thallium, tellurium, lead, bismuth, aluminum, gallium, germanium, and tellurium, and alloys thereof are preferably used. Compounds of arbitrary transition metals of from scandium to zinc of atomic numbers 21 to 30, from yttrium to cadmium of atomic numbers 39 to 48, from hafnium to mercury of atomic numbers 72 to 80, and lanthanoid-based rare earth metals of atomic numbers 57 to 71 can be used. (Since zinc, cadmium and mercury generally have the structures which an electron shell may have, there are cases that they are contained in the transition metal and not contained in the transition metal, but the present invention includes these elements in the transition metal as they also exhibit the effect of the present invention.) Among these, aluminum, titanium, zinc, tantalum, zirconium, vanadium, niobium, molybdenum, and tungsten are preferred, and aluminum, titanium and zinc are particularly preferred.

A metal layer preferably has a film thickness of from 1 $\mu$m to 10 $\mu$m, more preferably from 1 $\mu$m to 5 $\mu$m, and particularly preferably from 2 $\mu$m to 4 $\mu$m. A metal layer can be provided by means of vacuum deposition, sputtering, CVD (chemical vapor deposition), electrodeposition, chemical plating, or electroplating. Further, a metal layer having a hydrophilic surface may be adhered to a metal support described later by means of the above-described various adhesives (heat-insulating layers), or the above-described various resins may be adhered to a metal support by fusing by heating.

The thickness of a metal layer is adjusted as follows.

An Al foil (plate or sheet) having a size of about 10 cm×20 cm and a thickness of about 0.24 mm is prepared, the accurate size of the Al foil (plate or sheet) is measured with calipers, and the weight is measured with a precision balance. A tape for preventing dissolution-etching (NITTO danpron tape) is then stuck (i.e., adhered) on the back surface of the Al foil (plate or sheet). As the etching solution composition, it is preferred to use (NaOH: from 20 to 30 wt %, Al: from 0 to 10 wt %, 50 to 80° C.). The Al foil (plate or sheet) is immersed in the etching solution for appropriate time, then immersed in an aqueous solution of from 20 to 40 wt % of sulfuric acid at from 50° C. to 70° C. for from 5 to 20 seconds to take away the aluminum hydroxide formed on the surface of the plate at etching, and thoroughly washed with water to remove off (i.e., peel off) the dissolution-etching preventing tape stuck on the back surface of the Al foil (plate or sheet). The Al foil (plate or sheet) is sufficiently dried and the weight after etching is measured with the precision balance. This procedure is repeated six or more times with varying the immersion time in the etching solution of a sample to prepare the analytical curve of time and etching amount. With the analytical curve obtained as the standard, immersion time is determined so as to reach the objective thickness of the Al foil (plate or sheet).

The etching amount ($g/m^2$) of the actual sample is calculated from the size of the sample measured with calipers in the same manner as described above and the weight change before and after etching. An etching thickness ($\mu$m) is the value obtained by dividing the obtained etching amount by the specific gravity of aluminum 2.69 ($g/cm^3$). The value obtained by subtracting the etching thickness from the thickness of the aluminum foil (plate or sheet) before etching ($\mu$m) is the thickness of the Al foil (plate or sheet) ($\mu$m). For precaution's sake, the thicknesses before and after etching are measured at ten points with a micrometer to calculate the thickness of the Al foil (plate or sheet), and the average and the standard deviation are computed. Further, for the sake of confirmation, a cross section is produced by a microtome, observed with an SEM, and the average and the standard deviation of the thickness of the Al foil (plate or sheet) are computed from the observation at ten points. In general, the thicknesses obtained by a weight variation method, a micrometer measuring method and an SEM observation method coincide within the error range.

As the surface treatment of the above-described metal layer surface according to the present invention, which is the same as the surface treatment method of an aluminum support as disclosed in JP-A-11-84675, it is preferred to perform all of mechanical surface-roughening treatment, chemical dissolution treatment 1, electrolytic surface-roughening treatment, chemical dissolution treatment 2, and anodic oxidation treatment, or some of these treatments in combination in this order.

As mechanical surface-roughening treatment, there are methods of transferring, brushing and liquid honing, These methods may be employed in combination from the viewpoint of productivity.

When the substrate comprising a metal support having provided thereon a heat-insulating layer and a metal layer in this order from the support (hereinafter referred to as "the metal layer-laminated plate") is subjected to surface treatment, various methods can be used as transferring method for pressure welding concavities and convexities on the metal layer surface of the metal layer-laminated plate. That is, in addition to JP-A-55-74898, JP-A-60-36195 and JP-A-60-203496, the technique of performing transferring a couple of times as disclosed in JP-A-6-55871, and the technique characterized in that the surface is elastic as disclosed in JP-A-6-24168 are also applicable to the present invention.

Further, transferring may be carried out repeatedly using a transferring roll engraved with minute concavities and convexities by means of electric discharge machining, shot blasting, laser beams or plasma etching, or transferring may be carried out repeatedly by bringing the face of a roll coated with fine particles to make the face uneven into contact with the metal layer surface of the metal layer-laminated plate and applying pressure on the roll several times, to thereby transfer the concave/convex pattern corresponding to the average diameter of fine particles to the surface of the metal layer.

Methods of giving minute concavities and convexities to a transferring roll are well-known and disclosed, e.g., in JP-A-3-8635, JP-A-3-66404 and JP-A-63-65017. Also, square concavities and convexities may be provided on the surface of a roll by grooving finely from two directions by dies, bites or laser beams. Further, the surface of the roll may be treated by known etching treatment and the like to make the formed square concavities and convexities round. The surface of the roll may of course be subjected to hardening or hard chrome plating to increase hardness.

FIG. 1 is a schematic view showing one example of mechanical surface-roughening processing step using a brush. Work plate (i.e., plate to be processed) 101 such as the metal layer-laminated plate of the present invention is traveled in the arrow direction with being supported by supporting roller 107, abrasive slurry 103 is sprayed uniformly on the surface of work plate 101, and brush roll 102 is rotated on the surface of 101, thereby mechanical surface-roughening treatment is performed. In this example, spraying of abrasive slurry and surface-roughening treatment by a brush roll is performed at two places.

When a brush is used, the brush preferably has bending elastic modulus of from 10,000 to 40,000 $kg/cm^2$, preferably from 15,000 to 35,000 $kg/cm^2$, and nerve (defined in JISK6200 (ISO1382) of the brush hair (i.e., the bristle) is 500 g or less, preferably 400 g or less. It is also preferred to use abrasives having a particle size of from 20 to 80 $\mu$m, and preferably from 30 to 60 $\mu$m.

Materials of the brush are preferably those having the above mechanical strengths, but materials having mechanical strengths out of the above ranges can also be used, e.g., synthetic resins and metals can be arbitrarily selected. As synthetic resins, polyamides, e.g., nylon, polyolefins, e.g., polypropylene, polyesters, e.g., polyvinyl chloride and polybutylene terephthalate, and polycarbonate can be exemplified, and examples of metals include stainless steel and brass.

Particle sizes of the materials of the abrasive are also preferably within the above range but the materials are not particularly limited, and can be selected from among alumina, silica, silicon carbide, and silicon nitride which have been conventionally used in mechanical surface-roughening treatment.

Mechanical surface-roughening treatment is performed by pressing the roll brush having the above-described brush hair against an aluminum plate surface while rotating at high speed with supplying the above-described abrasive to the roll brush. The rotary rate and the pressure welding force of the roll brush and the feeding rate of the abrasive at this time are not particularly restricted.

The apparatus disclosed in JP-B-50-40047 (the term "JP-B" as used herein means an "examined Japanese patent publication") can be suitably used in the above mechanical surface-roughening treatment.

After mechanical surface-roughening treatment, the metal layer surface of the metal layer-laminated plate is subjected to chemical etching with an alkali solution having a pH value of 11 or more, preferably 13 or more, with a view to smoothing and uniforming the aluminum plate.

Figure 2:
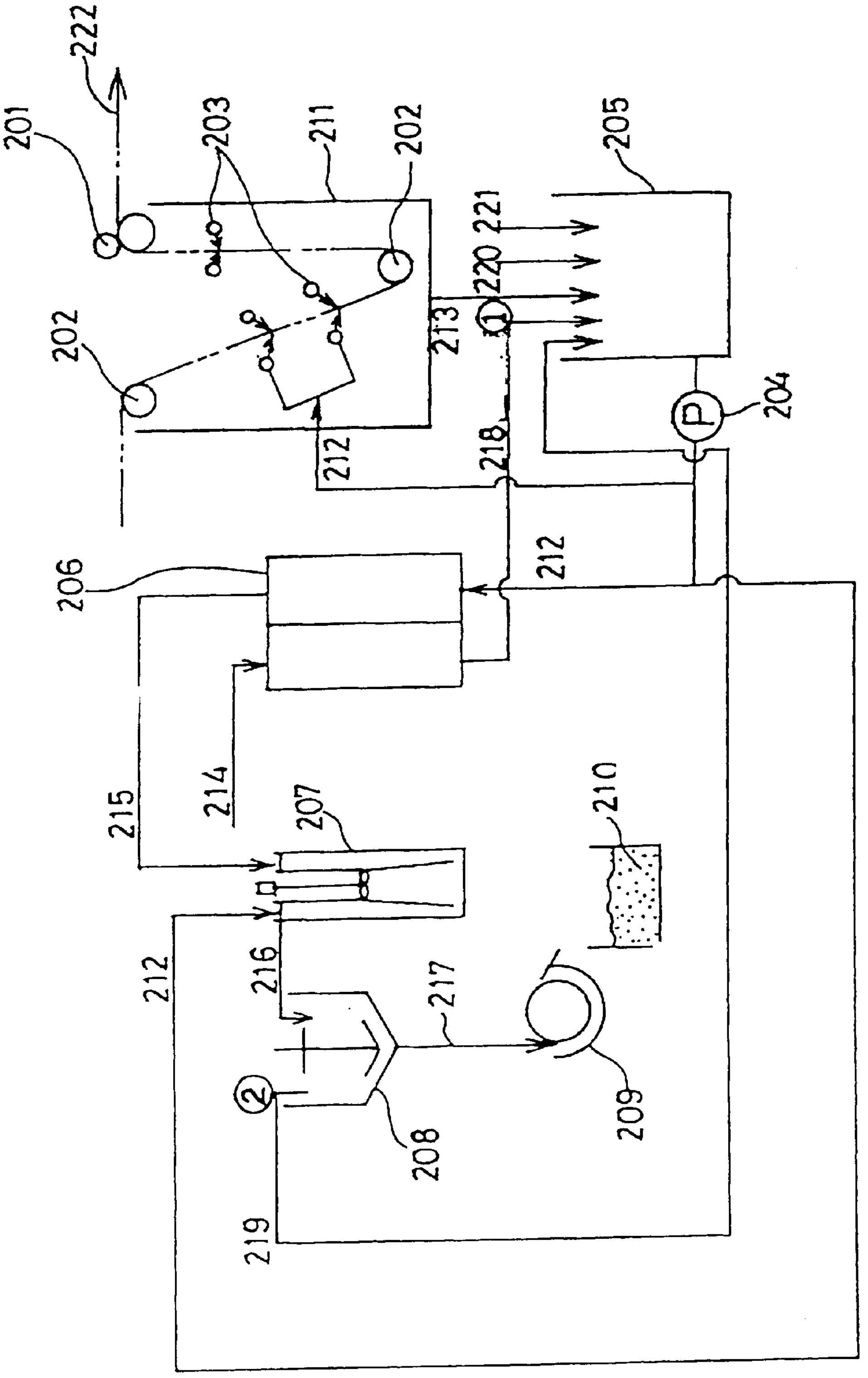
FIG. 2 is a schematic view showing one example of chemical surface-roughening treatment step which is used in chemical surface-roughening treatment of the metal layer surface of a metal layer laminate.

FIG. 2 is a schematic view showing one example of chemical etching processing step of the metal layer surface of the metal layer-laminated plate. Metal layer-laminated plate 222 is guided through etching processing tank 211 by means of passing roll 202 and nip roll 201. In etching processing tank 211, an alkali solution in solution-preparing tank 205 is fed through feeding pipeline 212 by solution-feeding pump 204 (P) and the processing solution (an etching solution comprising mainly sodium hydroxide) is sprayed by spray 203 in the width direction of metal layer-laminated plate 222 uniformly all over the direction, thereby metal layer-laminated plate 222 undergoes surface etching. When the metal layer-laminated plate comes out from the etching tank, the nip roll wipes off the surface of plate to prevent the processing solution from being carried over from the tank.

The processing solution is prepared in solution-preparing tank 205 and the prepared processing solution is fed to spray 203 through feeding pipeline 212 by means of solution-feeding pump 204. The processing solution from solution-preparing tank 205 can further be fed to diffusion tank 206 or precipitation tank 207 through feeding pipelines 212' and 212' branched from feeding pipeline 212, respectively, by means of solution-feeding pump 204. The feeding amount and time can be controlled by the operation of valves provided within the pipeline (not shown in the figure).

The solution-preparing tank and the etching processing tank are linked via feeding pipeline 212 and returning solution pipeline 213 and the processing solution circulates through these. The amount of the processing solution and the concentration of the components are varied such that the sodium hydroxide component in the processing solution is reduced during etching treatment, the aluminum ion content is increased due to the aluminum component in the metal layer-laminated support or the metal layer, and water is reduced due to evaporation. Therefore, a sodium hydroxide solution and water are supplied to the processing solution in the solution-preparing tank through supplying pipelines 200 and 201, respectively. It is unavailing to maintain the aluminum ions in the processing solution in a prescribed concentration by a replenising solution without reducing the increasing aluminum ions.

Accordingly, a part of the processing solution in the solution-preparing tank is arbitrarily fed to diffusion dialysis tank 206, and a part of the processing solution circulating in use is arbitrarily fed to precipitation tank 207 through feeding pipelines 212' and 212", respectively, to remove aluminum ions from the system. In diffusion dialysis tank 206, about 70% of the fed processing solution is recovered as a sodium hydroxide solution, and returned as recovered solution (1) to the solution-preparing tank through recovering pipeline 218. On the other hand, the waste solution dialyzed in the diffusion dialysis tank becomes a supersaturated sodium aluminate solution and introduced to precipitation tank 207 through pipeline for dialyzed waste solution 215. Water can be added to the diffusion dialysis tank for replenishing for the evaporated water via feeding pipeline 214.

In precipitation tank 207, the dialyzed waste solution from the diffusion dialysis tank and the processing solution from the solution-preparing tank are mixed, and aluminum hydroxide is crystallized from the mixed solution with the seed of the aluminum hydroxide in the supersaturated sodium aluminate solution as a nucleus. The mixture of the processing solution mainly comprising a sodium hydroxide solution from which aluminum ions have been removed and the aluminum hydroxide crystals is fed to thickener 208 through feeding pipeline 216. The crystallized aluminum hydroxide passes through pipeline 217 and syneresis occurs at drum filter 209 and collected in hopper 210. On the other hand, the processing solution mainly comprising a sodium hydroxide solution is returned as recovered solution (2) to the solution-preparing tank through recovering pipeline 219. FIG. 2 is an example of chemical etching processing step using diffusion dialysis but a method of crystallization may be used.

The etching amount in chemical etching treatment is from 3 $g/m^2$ to 25 $g/m^2$, preferably from 3 $g/m^2$ to 15 $g/m^2$. When the etching amount is less than 5 $g/m^2$, concavities and convexities formed by mechanical surface-roughening treatment cannot be smoothed and uniform pits cannot be formed in the later electrolytic treatment. On the other hand, if the etching amount exceeds 25 $g/m^2$, the foregoing concavities and convexities are vanished.

As usable alkali solutions in the present invention, an aqueous sodium salt solution such as sodium hydroxide, sodium carbonate, sodium bicarbonate, or sodium sulfate, an aqueous silicate solution such as sodium orthosilicate, sodium metasilicate, sodium disilicate, or sodium tetrasilicate, and an aqueous phosphate solution such as sodium primary phosphate, sodium secondary phosphate, sodium tertiary phosphate, sodium tripolyphosphate, sodium pyrophosphate, or sodium hexametaphosphate can be exemplified.

As conditions of chemical etching treatment, the concentration of an alkali solution is from 0.01 to 50% wt %, the temperature is from 20 to 90° C., and the time is from 5 seconds to 5 minutes, and these conditions are arbitrarily selected so that the etching amount falls within the above range.

As a result of chemical etching of the metal layer surface of the metal layer-laminated plate using the above alkali solution, insoluble residue, i.e., smut, is formed on the surface of the plate, which is removed with an acid solution having the same composition as the acid solution which is used in the later electrolytic surface-roughening treatment.

Preferred treatment conditions are the temperature of from 30 to 80° C. and the time of from 3 seconds to 3 minutes.

The thus-treated metal layer-laminated plate is subjected to electrolytic surface-roughening treatment. In the electrolytic surface-roughening treatment according to the present invention, it is preferred to perform the first and second electrolytic treatments in an acid solution by alternating wave electric current before and after cathode electrolytic treatment. Smut is formed on the surface of the metal layer surface of the metal layer-laminated plate due to cathode electrolytic treatment and, at the same time, hydrogen gas is generated, thus more uniform electrolytic surface roughening becomes possible.

In the first place, the first and second electrolytic treatments in an acid solution by alternating wave electric current will be explained. The first treatment and the second treatment of electrolytic surface-roughening treatment may be performed on the same condition or may be different from each other within the preferred range of conditions.

Figure 3:
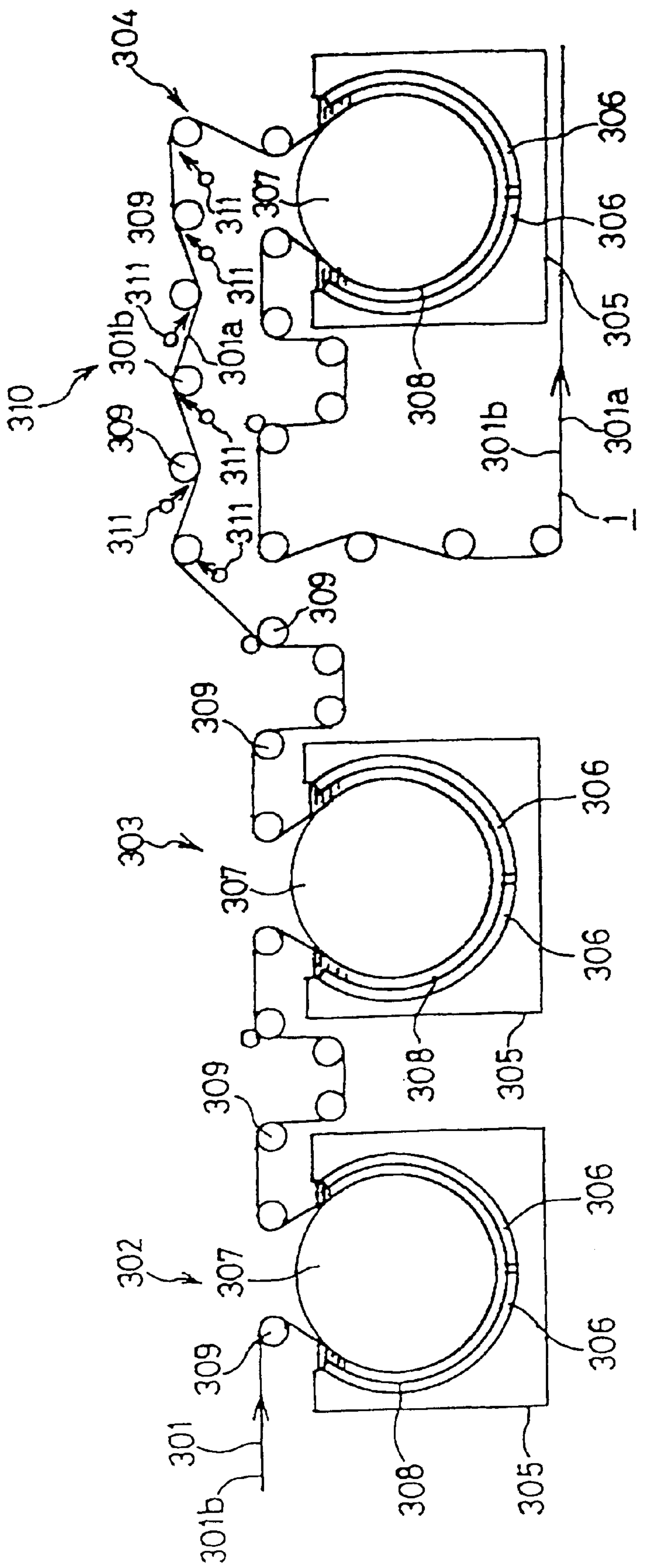
FIG. 3 is a schematic view showing one example of electrolytic surface-roughening treatment step which is used in electrolytic surface-roughening treatment of the metal layer surface of a metal layer laminate.

FIG. 3 is a schematic view showing one example of treatment step of the metal layer-laminated support including a first and second electrolytic surface-roughening treatments.

In FIG. 3, symbol 301 is the metal layer-laminated support, 301*a* is a front surface (the surface to be subjected to electrolytic surface-roughening treatment first), and 301*b* is a back surface (the surface to be subjected to electrolytic surface-roughening treatment later).

Symbol 302 is a first front surface-roughening unit for electrolytically roughening front surface 301*a* of metal layer-laminated support 301, symbol 303 is a second front surface-roughening unit for electrolytically roughening front surface 301*a* of metal layer-laminated support 301, and symbol 304 is a back surface-roughening unit for electrolytically roughening back surface 301*b* of metal layer-laminated support 301. These front surface-roughening units 302 and 303 and back surface-roughening unit 304 are provided with a pair of circular main electrodes 306, 306 connected to electrolytic cell 305 via ac power (not shown), and rotatable drum roll 307 is arranged above main electrode 306. Electrolyte 308 is filled between main electrode 306 and drum roll 307.

Among first front surface-roughening unit 302, second front surface-roughening unit 303 and back surface-roughening unit 304, a plurality of passing rolls 309 are arranged at prescribed positions, to thereby form a path of metal layer-laminated support 301. The path between second front surface-roughening unit 303 and back surface-roughening unit 304 makes, in back surface-roughening unit 304, reverse path 310 to reverse metal layer-laminated support 301 so that front surface 301*a* comes to be contact with drum roll 307 and back surface 301*b* is immersed in electrolyte 308. Reverse path 310 is provided with a plurality of sprayers 311 for spraying electrolyte to metal layer-laminated support 301.

For producing the metal layer-laminated support by the above-described apparatus, metal layer-laminated support 301 is traveled with the application of electric power to each main electrode 306 of surface-roughening units 302, 303 and 304. As a result, front surface 301*a* of metal layer-laminated support 301 is continuously surface-roughened in first front surface-roughening unit 302 and second front surface-roughening unit 303. Metal layer-laminated support 301 whose front surface 301*a* has undergone surface-roughening treatment passes through reverse path 310, and sent to back surface-roughening unit 304 in a reversed state so that front surface 301*a* comes to be contact with drum roll 307 of back surface-roughening unit 304 and back surface 301*b* is immersed in electrolyte 308. Metal layer-laminated support 301 is maintained always in a wet state by being sprayed with electrolyte from a plurality of sprayers 311 during traveling through reverse path 310.

This electrolytic surface-roughening treatment can follow electrochemical graining method as disclosed, e.g., in JP-B-48-28123 and British Patent 896,563. This electrolytic graining method uses sine wave alternating current but specific wave forms such as those disclosed in JP-A-52-58602 may be used. Wave forms as disclosed in JP-A-3-79799 can also be used.

Various methods such as those disclosed in JP-A-55-158298, JP-A-56-28898, JP-A-52-58602, JP-A-52-152302, JP-A-54-85802, JP-A-60-190392, JP-A-58-120531, JP-A-63-176187, JP-A-1-5889, JP-A-1-280590, JP-A-1-118489, JP-A-1-148592, JP-A-1-178496, JP-A-1-188315, JP-A-1-154797, JP-A-2-235794, JP-A-3-260100, JP-A-3-253600, JP-A-4-72079, JP-A-4-72098, JP-A-3-267400, and JP-A-1-141094 can also be referred to.

Frequencies suggested in electrolytic condenser can also be used in addition to the above, e.g., those disclosed in U.S. Pat. Nos. 4,276,129 and 4,676,879.

As the acid solution which is an electrolyte, besides nitric acid and hydrochloric acid, those disclosed in U.S. Pat. Nos. 4,671,859, 466,576, 4,661,219, 4,618,405, 462,628, 4,600, 482, 4,566,960, 4,566,958, 4,566,959, 4,416,972, 4,374,710, 4,336,113, and 4,184,932 can also be used.

The concentration of an acid solution is preferably from 0.5 to 2.5 wt % but from 0.7 to 2.0 wt % is especially preferred taking into consideration the use in the above smut removal. The temperature of the solution is preferably from 20 to 80° C. and particularly preferably from 30 to 60° C.

Various electrolytic cells and electric powers are suggested, e.g., those disclosed in the following patents: U.S. Pat. No. 4,203,637, JP-A-56-123400, JP-A-57-59770, JP-A-53-12738, JP-A-53-32821, JP-A-53-32822, JP-A-53-32823, JP-A-55-122896, JP-A-55-132884, JP-A-62-127500, JP-A-1-52100, JP-A-1-52098, JP-A-60-67700, JP-A-1-230800, and JP-A-3-257199.

In addition to the above, e.g., electrolytic cells and electric powers disclosed in the following patents can also be applied to the present invention: JP-A-52-58602, JP-A-52-152302, JP-A-53-12738, JP-A-53-12739, JP-A-53-32821, JP-A-53-32822, JP-A-53-32833, JP-A-53-32824, JP-A-53-32825, JP-A-54-85802, JP-A-55-122896, JP-A-55-132884, JP-B-48-28123, JP-B-51-7081, JP-A-52-133838, JP-A-52-133840, JP-A-52-133844, JP-A-52-133845, JP-A-53-149135, and JP-A-54-146234.

The electrolytic treatment is carried out with the quantity of the anode electricity of from 30 to 400 C./$dm^2$, preferably from 50 to 200 C./$dm^2$. If the quantity of the anode electricity is less than 30 C./$dm^2$, uniform pits cannot be formed. On the other hand, if it exceeds 400 C./$dm^2$, pits become too large.

The metal layer-laminated plate undergoes cathode electrolytic treatment during the above first and second electrolytic surface-roughening treatments. Smut is formed on the metal layer surface of the metal layer-laminated plate due to the cathode electrolytic treatment and, at the same time, hydrogen gas is generated, thus more uniform electrolytic surface-roughening becomes possible.

The cathode electrolytic treatment is performed in an acid solution with the quantity of the cathode electricity of from 3 to 80 C./$dm^2$, preferably from 5 to 30 C./$dm^2$. If the quantity of the cathode electricity is less than 3 C./$dm^2$, the smut adhesion amount is insufficient, while if it exceeds 80 C./$dm^2$, smut excessively adheres to the metal layer surface, which is disadvantageous.

The Electrolyte (i.e., Elecrtolytic solution) used at this time may be the same as or different from the solution used in the first and the second electrolytic surface-roughening treatments.

After the second electrolytic surface-roughening treatment, the metal layer-laminated plate is subjected to the second chemical etching treatment using an alkali solution having pH of 11 or higher. The alkali solution having pH of 11 or higher used in the second chemical etching treatment may be the same as or different from the alkali solution used in the above-described first chemical etching treatment.

However, the etching amount is different from that in the first chemical etching treatment, and is generally from 0.1 to 8 g/$m^2$, preferably from 0.2 to 3.0 g/$m^2$, and still more preferably from 0.5 to 1.5 g/$m^2$. If the etching amount is less than 0.1 g/$m^2$, the edge part of the pit obtained by the electrolytic treatment cannot be smoothed, while if it exceeds 8 g/$m^2$, pits are vanished.

The smut generated by the above chemical etching treatment is removed from the metal layer-laminated plate with a solution mainly comprising a sulfuric acid. "A solution mainly comprising a sulfuric acid" means a mixed solution containing a phosphoric acid, a nitric acid, a chromic acid or a hydrochloric acid appropriately, as well as a solution comprising a sulfuric acid alone. As for the smut removal using a solution mainly comprising a sulfuric acid, JP-A-53-12739 can be referred to.

Alkali treatment may be combined with the removal of smut and JP-A-56-51388 can be referred to, for instance.

The methods disclosed in the following patents may also be used together, e.g., JP-A-60-8091, JP-A-63-176188, JP-A-1-38291, JP-A-1-127389, JP-A-1-188699, JP-A-3-177600, JP-A-3-126891 and JP-A-3-191100.

An anodic oxidation film (i.e., anodized filem) is then formed on the metal layer surface of the metal layer-laminated plate.

Figure 4:
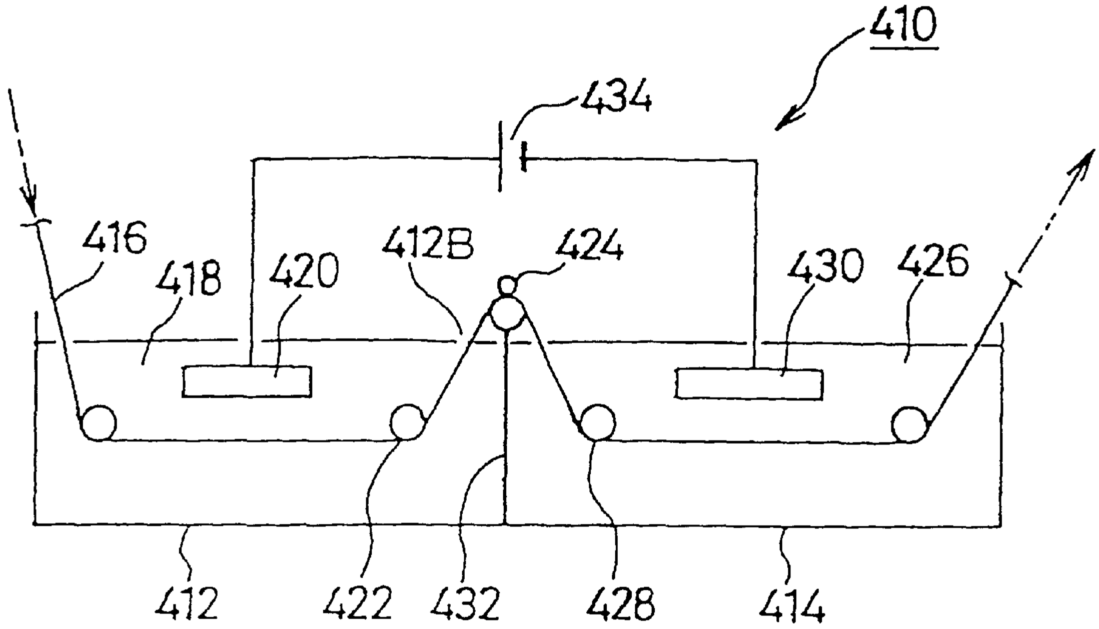
FIG. 4 is a schematic view showing one example of anodic oxidation treatment step which is used in anodic oxidation treatment of the metal layer surface of a metal layer laminate.

FIG. 4 is a schematic view showing one example of an anodic oxidation treatment step of the metal layer surface of the metal layer-laminated plate.

Metal layer-laminated plate 416 is transported as shown by arrows in FIG. 4. Metal layer-laminated plate 416 is charged in plus (+) by electric power supplying electrode 420 in electric power supplying tank 412 where electrolyte 418 is reserved. Metal layer-laminated plate 416 is transported upward by roller 422 in electric power supplying tank 412, the direction is converted downward by nip roller 424, transported toward electrolytic treating tank 414, and the course is changed in the horizontal direction by roller 428. Metal layer-laminated plate 416 is then charged in minus (−) by electrolytic electrode 430, thereby an anodic oxidation film (i.e., anodized filem) is formed on the surface of metal layer-laminated plate 416, and metal layer-laminated laminated plate 416 came out of electrolytic treating tank 414 is transported to the post step.

In anodic oxidation treating unit 410, direction converting means is constituted of roller 422, nip roller 424 and roller 428, and metal layer-laminated plate 416 is transported by rollers 422, 424 and 428 in conical shape (i.e., Λ shape) and reverse U shape at the part between electric power supplying tank 412 and electrolytic treating tank 414. Electric power supplying electrode 420 and electrolytic electrode 430 are connected to direct current electric source 434.

Anodic oxidation treating unit 410 in FIG. 4 is characterized in that anodic oxidation treating unit 410 is partitioned into electric power supplying tank 412 and electrolytic treating tank 414 by bulkhead 432 and metal layer-laminated plate 416 is transported in conical shape and reverse U shape at the part between both tanks. The length of metal layer-laminated plate 416 between two tanks can be made the shortest by this constitution. Accordingly, the overall length of anodic oxidation treating unit 410 can be made short, which leads to the saving of installation cost.

By transporting metal layer-laminated plate 416 in conical shape and reverse U shape, it is not necessary to provide an opening at each tank wall of tanks 412 and 414 to pass metal layer-laminated plate 416 through walls. As a result, since the feeding amount of liquid which is required to maintain necessary liquid level height in tanks 412 and 414 can be suppressed, operating cost can be reduced.

In this case, an anodic oxidation film (i.e., anodized filem) can be formed, for instance, by turning on an electric current to the metal layer-laminated plate as the anode in a solution of the concentration of sulfuric acid of from 50 to 300 g/liter and aluminum concentration of 5 wt % or less. A phosphoric acid, a chromic acid, an oxalic acid, a sulfamic acid or a benzenesulfonic acid may be mixed in the above solution.

It is preferred that the amount of the anodic oxidation film (i.e., anodized filem) to be formed is from 1.0 to 5.0 g/$m^2$, particularly preferably from 1.5 to 4.0 g/$m^2$.

Since the treatment conditions of anodic oxidation vary according to the electrolytes, in general the concentration of an electrolyte is from 1 to 80 wt %, the temperature of the solution is from 5 to 70° C., the electric current density is from 0.5 to 60 A/$cm^2$, the voltage is from 1 to 100 V, and the period of time of electrolysis is from 15 seconds to 50 minutes, and conditions are adjusted so as to obtain the above film amount.

Examples of electrolytic apparatus are disclosed, e.g., in JP-A-48-26638, JP-A-47-18739 and JP-B-58-24517. The methods disclosed in JP-A-54-81133, JP-A-57-47894, JP-A-57-51289, JP-A-57-51290, JP-A-57-54300, JP-A-57-136596, JP-A-58-107498, JP-A-60-200256, JP-A-62-136596, JP-A-63-176494, JP-A-4-176897, JP-A-4-280997, JP-A-6-207299, JP-A-5-24377, JP-A-5-32083, JP-A-5-125597 and JP-A-5-195291 can also applied to the present invention.

It is preferred for the metal layer-laminated plate to be subjected to hydrophilizing treatment as described below for further increasing the hydrophilicity of the metal or the metal compound of the metal layer surface of the metal layer-laminated plate. There are a method of treatment using alkali metal silicate as disclosed in U.S. Pat. Nos. 2,714,066 and 3,181,461, a method of using potassium zirconate fluoride as disclosed in JP-B-36-22063, and a method of treatment using polyvinyl phosphonic acid as disclosed in U.S. Pat. No. 4,153,461.

Moreover, a method of treatment using an aqueous solution containing a phosphate and an inorganic fluorine compound as disclosed in JP-A-9-244227, and a method of treatment using an aqueous solution containing a titanium and a fluorine as disclosed in JP-A-12-81704 and JP-A-12-89466 can also be applied to the present invention.

Alkali metal silicate treatment and polyvinyl phosphonic acid treatment are suitable above all.

Hydrophilization Treatment

The metal layer surface of the metal layer-laminated plate undergone anodic oxidation treatment as described above is subjected to hydrophilization treatment to hydrophilize the anodic oxidation film (i.e., anodized film) with an aqueous solution containing alkali metal silicate. Various conventionally well-known methods can be used for the hydrophilization treatment with alkali metal silicate. The amount of alkali metal silicate adhered to the metal layer surface of the metal layer-laminated plate is from 0.1 to 8 mg/$m^2$, preferably from 0.5 to 6 $mg/M^2$, and more preferably from 0.5 to 4 $mg/m^2$, in terms of the amount of an Si atom. When the adhesion amount is less than 0.1 $g/m^2$in terms of the amount of an Si atom, staining preventing property is inferior and the expected results cannot be achieved. Further, when a developing solution not containing alkali metal silicate is used, the whitening of a non-image area and the generation of smudge and scum by development cannot be prevented. Further, when the adhesion amount of alkali metal silicate to the metal layer surface of the metal layer-laminated plate exceeds 8 $mg/m^2$ in terms of the amount of an Si atom, the press life is inferior and the expected results cannot be achieved.

In the present invention, the amount of alkali metal silicate adhered to the metal layer surface of the metal layer-laminated plate is measured as the amount of an Si atom (Si $mg/m^2$) by an analytical curve method with XRF (X-Ray Fluorescence Spectrometer). As the standard sample for preparing an analytical curve, a sample obtained by uniformly dripping an aqueous solution of sodium silicate containing the already known amount of an Si atom on an aluminum substrate of the area of within 30 mmϕ and drying is used. The kind of XRF is not particularly limited. In the examples of the present invention described later, RIX3000 (manufactured by Rigaku Denki Kogyo Co., Ltd.) was used and the amount of an Si atom was measured from the peak height of Si-Kα spectrum under the following conditions.

Apparatus: RIX3000 (manufactured by Rigaku Denki Kogyo Co., Ltd.)
X-ray tube: Rh
Measuring spectrum: Si-Kα
Tube voltage: 50 kV
Tube current: 50 mA
Slit: COARSE
Spectral crystal: RX4
Detector: F-PC
Area analyzed: 30 mmϕ
Peak position (2θ): 144.75 deg.
Back ground (2θ): 140.70 deg., 146.85 deg.
Estimation time: 80 sec/sample Sodium silicate, potassium silicate and lithium silicate are used as the alkali metal silicate for use in hydrophilization treatment.

The concentration of the alkali metal silicate for use in the hydrophilization treatment is from 0.01 to 30 wt %, preferably 0.01 to 10 wt %, and particularly preferably from 0.05 to 3 wt %. The hydrophilization treatment can be performed preferably by selecting the conditions such as the concentration of alkali metal silicate, treatment temperature and treatment time so that the adhesion amount of an Si atom reaches the above-described specific amount by the method of immersing the above-described metal layer in an aqueous solution of alkali metal silicate having pH at 25° C. of from 10 to 13 at 4 to 80° C. for 0.5 to 120 seconds, preferably from 2 to 30 seconds.

In the hydrophilization treatment according to the present invention, if necessary, a hydroxide can be added to increase the pH of the aqueous solution of alkali metal silicate, e.g., sodium hydroxide, potassium hydroxide, or lithium hydroxide.

Further, if necessary, alkaline earth metal salts or metal salts belonging to IVb group in the periodic table may be added to the aqueous solution of alkali metal silicate. As alkaline earth metal salts, nitrate, e.g., calcium nitrate, strontium nitrate, magnesium nitrate, and barium nitrate, and water-soluble salts of these alkaline earth metal salts, such as sulfate, hydrochloride, phosphate, acetate, oxalate, and borate, can be exemplified, and as metal salts belonging to IVb group in the periodic table, titanium tetrachloride, titanium trichloride, titanium potassium fluoride, titanium potassium oxalate, titanium sulfate, titanium tetraiodide, zirconium chloride oxide, zirconium dioxide, zirconium oxychloride, and zirconium tetrachloride can be exemplified. Alkaline earth metal salts or metal salts belonging to IVb group in the periodic table can be used alone or in combination of two or more thereof. These metal salts are preferably used in an amount of from 0.01 to 10 wt %, more preferably from 0.05 to 5.0 wt %, based on the aqueous solution of alkali metal silicate.

The concentration of the aqueous solution for use for the polyvinyl phosphonic acid treatment is from 0.01 to 10 wt %, preferably from 0.1 to 5 wt %, and particularly preferably from 0.2 to 2.5 wt %. It is preferred to perform the treatment at 10 to 70° C., preferably from 30 to 60° C., and for 0.5 second to 10 minutes, preferably from 1 to 30 seconds.

After an anodic oxidation film (i.e., anodized film) has been formed as described above, for achieving the optimal adhesion of the support with photosensitive composition, an apparatus for sealing treatment of the support with water vapor and hot water (disclosed in JP-B-56-12518) may be used, after etching of the anodic oxidation film (i.e., anodized film), thereby a photosensitive printing plate which shows good storage stability with the lapse of time, good developing property and generates no staining on the non-image area can be obtained. Further, sealing treatment may be performed by the apparatuses and the methods as disclosed in JP-A-4-4194, JP-A-5-202496, JP-A-5-179482 and JP-A-5-179482.

In addition, various treating methods and compounds can be used in the present invention as described below. That is, the potassium fluorozirconate treatment as disclosed in U.S. Pat. No. 2,946,638, the phosphomolybdate treatment disclosed in U.S. Pat. No. 3,201,247, the alkyl titanate treatment as disclosed in British Patent 1,108,559, the polyacrylic acid treatment as disclosed in German Patent 1,091, 433, the polyvinyl phosphonic acid treatment as disclosed in German Patent 1,134,093 and British Patent 1,230,447, the phosphonic acid treatment as disclosed in JP-B-44-6409, the phytic acid treatment as disclosed in U.S. Pat. No. 3,307, 951, the treatment by salts of lipophilic organic high molecular compounds and divalent metals as disclosed in JP-A-58-16893 and JP-A-58-18291, the method of providing a subbing layer of hydrophilic cellulose (e.g., carboxymethyl cellulose, etc.) containing water-soluble metal salts (e.g., zinc acetate, etc.) as disclosed in U.S. Pat. No. 3,860, 426, the method of hydrophilization treatment performed by providing a subbing layer of water-soluble polymers having a sulfonic acid group as disclosed in JP-A-59-101651, the phosphates as disclosed in JP-A-62-019494, the water-soluble epoxy compounds as disclosed in JP-A-62-033692, the phosphoric acid-modified starches as disclosed in JP-A-62-097892, the diamine compounds as disclosed in JP-A-63-056498, the inorganic or organic acids of amino acids as disclosed in JP-A-63-130391, the organic phosphonic acids containing a carboxyl group or a hydroxyl group as disclosed in JP-A-63-145092, the compounds having an amino group and a phosphonic acid group as disclosed in JP-A-63-165183, the specific carboxylic acid derivatives as disclosed in JP-A-2-316290, the phosphoric esters as disclosed in JP-A-3-215095, the compounds having one amino group and one oxyacid group of phosphorus as disclosed in JP-A-3-261592, the phosphoric acid esters as disclosed in JP-A-3-215095, the aliphatic or aromatic phosphonic acids such as a phenylphosphonic acid as disclosed in JP-A-5-246171, the compounds containing an S atom such as a thiosalicylic acid as disclosed in JP-A-1-307745, the methods of prime-coating of the compounds having an oxyacid group of phosphorus as disclosed in JP-A-4-282637, and the methods of coloring with acid dyes as disclosed in JP-A-60-64352 can be applied to the present invention.

(c) Metal Support

Various metals can be used as the metal support of the lithographic printing plate precursor according to the present invention. An aluminum plate is preferably used above all.

The aluminum plate for use in the present invention is a plate of pure aluminum or aluminum alloys containing a trace amount of foreign elements with aluminum as a main component. Foreign elements which may be contained in aluminum alloy are silicon, iron, manganese, copper, magnesium, chromium, zinc, bismuth, nickel, titanium, etc. As the alloy components, the content of foreign elements is preferably 10% by weight or less. Preferred aluminum for use in the present invention is pure aluminum, but 100% pure aluminum is difficult to produce from the refining technique, accordingly it is preferred that the content of foreign elements is the least possible amount. The aluminum alloys having the above-described content of foreign elements are usable in the present invention. The composition of the aluminum plate for use in the present invention is not specified as described above, and conventionally well-known and commonly used aluminum materials can be used arbitrarily. As preferred materials, JIS A 1050, JIS A 1100, JIS A 1200, JIS A 3003, JIS A 3103 and JIS A 3005 can be exemplified. The aluminum plate for use in the present invention has a thickness of from about 0.1 to about 0.6 mm.

The back surface of the aluminum support is provided with a back coating layer, if necessary. Coating layers comprising metallic oxides obtained by hydrolysis and polycondensation reactions of the organic high molecular compounds as disclosed in JP-A-5-45885 and the organic or inorganic metal compounds as disclosed in JP-A-6-35174 are preferably used as such a back coating layer.

Of these coating layers, alkoxyl compounds of silicon such as $Si(OCH_3)_4$, $Si (OC_2H_5)_4$, $Si(OC_3H_7)_4$, and $Si(OC_4H_9)_4$ are inexpensive and easily available, and coating layers of the metallic oxides obtained from these compounds are excellent in resistance against development and particularly preferred.

(d) Lipophilic Layer Which is Abraded (i.e., Fused and Removed) by Heating or Whose Solubility to Alkali is Transformed by Heating (Heat-sensitive Type Image-recording Layer)

As the image-recording layer of the lithographic printing plate precursor according to the present invention, a lipophilic layer which is abraded (i.e., fused and removed) by heating or whose solubility to alkali is transformed by heating (also referred to as "a heat-sensitive type image-recording layer") is used, and this lipophilic layer is provided on the above-described metal layer having a hydrophilic surface.

The heat-sensitive type image-recording layer is classified into three types mainly by the following functions.

Ablation Type Image-recording Layer

The irradiated part with laser beams of the uppermost image-recording layer is subjected to ablation (i.e., fused and removed) and splashed in the air by heat and the metal layer having a hydrophilic surface appears. This case does not necessitate a development step.

Thermal Positive Type Image-recording Layer

The uppermost image-recording layer is decomposed or softened by heat and the property of the image-recording layer is transformed to be soluble in a developing solution or the film strength is extremely deteriorated, and thereafter the irradiated part with laser beams of the image-recording layer is removed in a development step.

Thermal Negative Type Image-recording Layer

The uppermost image-recording layer is polymerized or hardened by heat and the property of the image-recording layer is transformed to be insoluble in a developing solution or the film strength is extremely strengthened, and thereafter the non-irradiated part with laser beams of the image-recording layer is removed in a development step.

(d-1) Ablation Type Image-Recording Layer

As the ablation type (i.e., the fusion and removal type) image-recording layer, as inorganic substances, metals such as Cr, Ti, materials having hydrophobicity (i.e., hydrophobic property) such as ternary alloys of Pb—Sb—Sn, etc., which are known as type metals, carbons such as coal, charcoal, diamond, DLC (diamond-like coating), graphite, and glassy carbon, oxide, nitride, silicide, and carbide can be exemplified. These compounds may be used not only as simple substances but also as mixtures. Specifically, aluminumoxide, siliconoxide, titanium oxide, zirconium oxide, hafnium oxide, vanadium oxide, niobium oxide, tantalum oxide, molybdenum oxide, tungsten oxide, and chromium oxide can be exemplified. Further, aluminum nitride, silicon nitride, titanium nitride, zirconium nitride, hafnium nitride, vanadium nitride, niobium nitride, tantalum nitride, molybdenum nitride, tungsten nitride, chromium nitride, silicon nitride, boron nitride, titanium silicide, zirconium silicide, hafnium silicide, vanadium silicide, niobium silicide, tantalum silicide, molybdenum silicide, tungsten suicide, chromium silicide, titanium boride, zirconium boride, hafnium boride, vanadium boride, niobium boride, tantalum boride, molybdenum boride, tungsten boride, chromium boride, aluminum carbide, silicon carbide, titanium carbide, zirconium carbide, hafnium carbide, vanadium carbide, niobium carbide, tantalum carbide, molybdenum carbide, tungsten carbide, and chromium carbide can be exemplified. Among inorganic substances, these inorganic substances are high in absorption rate of light having wavelength of from 760 to 1,064 nm such as YAG laser and LD laser, and they are such materials that layers capable of recording images by heat are abraded (i.e., fused and removed). Above all, Cr, Ti, Pb—Sb—Sn, diamond, DLC, $TiO_2$, $BaTiO_3$, $SrTiO_3$, $Si_3N_4$, and SiC which show affinity to ink (i.e., ink-receptivity) are preferred.

The ablation type image-recording layer is formed on a metal layer having a hydrophilic surface by methods such as deposition, CVD, sol-gel, sputtering, ion-plating, diffusion, electrodeposition, metal plating, etc.

As is generally performed after ablation, a step of physical scraping with a brush, etc. may be used to remove residual substances.

As specific examples of the organic substances, PMMA, EMA-styrene, polystyrene, and novolak which are generally known as hydrophobic polymers are exemplified. Since these polymers are low in absorption rate of light having wavelength of from 760 to 1,064 nm, appropriate light/heat converting materials may be dissolved, dispersed or mixed into the above polymers. As the light/heat converting materials, various kinds of commercially available YAG- and LD-absorbing dyes Cyabsorb IR-165 (manufactured by American Cyanamid), Epolight III-117, Epolight III-130, Epolight III-180, etc., can be used, and also the powders of the above-described inorganic substances may be dispersed or mixed into the above polymers.

(d-2) Thermal Positive Type Image-Recording Layer

The thermal positive type image-recording layer at least contains a high molecular compound which is transformed into alkali-soluble by heating and, if necessary, a light/ heat converting material described in detail later.

As the high molecular compounds which are transformed into alkali-soluble by heating for use in the thermal positive type image-recording layer, resins having an acid radical such as a phenolic hydroxyl group or a carboxyl group are exemplified. As the resins having a phenolic hydroxyl group, resol type phenolic resins and novolak type phenolic resins are exemplified and novolak resins are preferred among them. Examples of the novolak resins preferably used in the present invention include, e.g., a phenol/formaldehyde resin, cresol/formaldehyde resins such as an m-cresol/ formaldehyde resin, a p-cresol/formaldehyde resin, an o-cresol/ formaldehyde resin, an m-/p-mixed cresol/ formaldehyde resin, and phenol/cresol mixed (m-, p-, o-, and any of m-/p-, m-/o-, p-/o-mixture) formaldehyde resins. Resol type phenolic resins are also preferably used in the present invention, e.g., phenol/cresol mixed (m-, p-, o-, and any of m-/p-, m-/o-, p-/o-mixture) formaldehyde resins are preferred, and the phenolic resins disclosed in JP-A-61-217034 are particularly preferred.

As other high molecular compounds which are transformed into alkali-soluble by heating, e.g., copolymers containing a carboxyl group can be exemplified. For example, copolymers with monomers having at least one unsaturated bond(s) polymerizable with a carboxyl group (a COOH group) in one molecule are preferred. As the monomers having a carboxyl group, a methacrylic acid, an acrylic acid and an itaconic acid are exemplified. In addition to the above, the monomers represented by following formula (I), (II) or (III) is also preferably used:

(I)

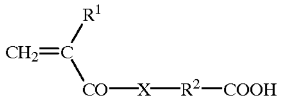

(II)

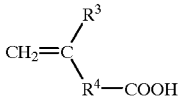

(III)

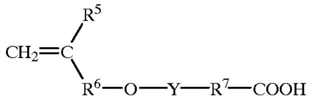

wherein $R^1$, $R^3$ and $R^5$ each represents a hydrogen atom or a methyl group; $R^2$, $R^4$, $R^6$ and $R^7$ each represents an alkylene group, a cycloalkylene group, an arylene group, or an aralkylene group each of which may have a substituent and has from 1 to 12 carbon atoms; X represents —O— or —$NR^8$—; Y represents a single bond or a —CO— group; $R^8$ represents a hydrogen atom, or an alkyl group, a cycloalkyl group, an aryl group, or an aralkyl group each of which may have a substituent and has from 1 to 12 carbon atoms, specifically, N-(4-carboxyphenyl)methacrylamide, N-(2-carboxyphenyl)methacrylamide, N-(4-chloro-2-carboxyphenyl)methacrylamide, 4-carboxyphenylethyl methacrylate, 4-carboxystyrene, 2-carboxyphenyloxyethyl acrylate can be exemplified.

As monomers which impart a property of being transformed into alkali-soluble by heating to high molecular compounds other than the above monomers having a carboxyl group, monomers comprising low molecular compounds having, in one molecule, one or more sulfonamido group(s) having at least one hydrogen atom bonded on the nitrogen atom and one or more polymerizable unsaturated bond(s) are preferred. Among these, monomers comprising low molecular compounds having an acryloyl group, an allyl group, or a vinyloxy group, and an unsubstituted or mono-substituted aminosulfonyl group or a substituted sulfonylamino group are preferred. The compounds represented by the following formula (IV), (V), (VI), (VII) or (VIII) can be exemplified as such a compound:

(IV)

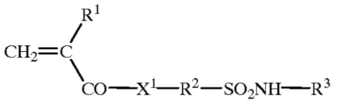

(V)

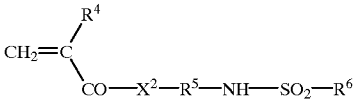

(VI)

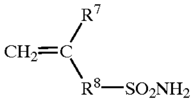

(VII)

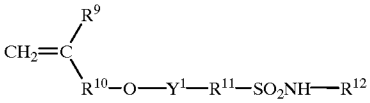

(VIII)

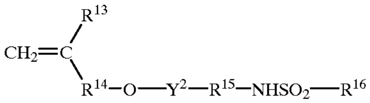

wherein $X^1$ and $X^2$ each represents —O— or —$NR^{17}$—; $R^1$ and $R^4$ each represents a hydrogen atom or —$CH_3$; $R^2$, $R^5$, $R^8$, $R^{11}$ and $R^{15}$ each represents an alkylene group, a cycloalkylene group, an arylene group, or an aralkylene group each of which may have a substituent and has from 1 to 12 carbon atoms; $R^3$, $R^{17}$ and $R^{12}$ each represents a hydrogen atom, or an alkyl group, a cycloalkyl group, an aryl group, or an aralkyl group each of which may have a substituent and has from 1 to 12 carbon atoms; $R^6$ and $R^{16}$ each represents an alkyl group, a cycloalkyl group, an aryl group, or an aralkyl group each of which may have a substituent and has from 1 to 12 carbon atoms; $R^7$, $R^9$ and $R^{13}$ each represents a hydrogen atom or —$CH_3$; $R^{10}$ and $R^{14}$ each represents a single bond, or an alkylene group, a cycloalkylene group, an arylene group, or an aralkylene group each of which may have a substituent and has from 1 to 12 carbon atoms; and $Y^1$ and $Y^2$ each represents a single bond or —CO—.

Specifically, m-aminosulfonylphenyl methacrylate, N-(p-aminosulfonylphenyl)methacrylamide, and N-(p-toluenesulfonyl)acrylamide are preferably used as such monomers.

As monomers other than the monomers represented by formula (IV), (V), (VI), (VII) or (VIII), monomers comprising low molecular compounds having, in one molecule, one or more active imino group(s) represented by —CO—NH—$SO_2$— and one or more polymerizable unsaturated bond(s)

are preferred. Specifically, N-(m-aminosulfonyl) methacrylamide, N-(p-aminosulfonyl)methacrylamide, N-(p-toluenesulfonyl)acrylamide are preferably used as such monomers. Further, acrylamide, methacrylamide, acrylate, and methacrylate having a phenolic hydroxyl group, or monomers comprising hydroxystyrene are also preferably used as other monomers. As such compounds, specifically, N-(4-hydroxyphenyl)acrylamide, N-(4-hydroxyphenyl)methacrylamide, o-hydroxyphenyl acrylate, m-hydroxyphenyl acrylate, p-hydroxyphenyl acrylate, o-hydroxystyrene, m-hydroxystyrene, and p-hydroxystyrene are exemplified.

As the copolymer components of the above monomers, e.g., the following monomers (1) to (11) can be exemplified, and two or more components of the following monomers may be used.

(1) Acrylates and methacrylates having an aliphatic hydroxyl group such as 2-hydroxyethyl acrylate, and 2-hydroxyethyl methacrylate.

(2) Alkyl acrylates, e.g., methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate.

(3) Alkyl methacrylates, e.g., methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, and N-dimethylaminoethyl methacrylate.

(4) Acrylamide or methacrylamide, e.g., acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(5) Vinyl ethers, e.g., ethyl vinyl ether, 2-chloroethyl vinyl ether, hydroxyethyl vinyl ether, propyl vinyl ether, butyl vinyl ether, octyl vinyl ether, and phenyl vinyl ether.

(6) Vinyl esters, e.g., vinyl acetate, vinyl chloroacetate, vinyl butyrate, and vinyl benzoate.

(7) Styrenes, e.g., styrene, α-styrene, methylstyrene, and chloromethylstyrene.

(8) Vinyl ketones, e.g., methyl vinyl ketone, ethyl vinyl ketone, propyl vinyl ketone, and phenyl vinyl ketone.

(9) Olefins, e.g., ethylene, propylene, isobutylene, butadiene, and isoprene.

(10) N-vinylpyrrolidone, N-vinylcarbazole, 4-vinylpyridine, acrylonitrile, and methacrylonitrile.

(11) Unsaturated imide, e.g., maleimide, N-acryloylacrylamide, N-acetylmethacrylamide, N-propionylmethacrylamide, and N-(p-chlorobenzoyl) methacrylamide.

The weight average molecular weight of these high molecular compounds which are transformed into alkali-soluble by heating is preferably from 500 to 200,000, and the number average molecular weight is preferably from 200 to 60,000. The high molecular compounds which are transformed into alkali-soluble by heating may be used alone or they may be used in combination of two or more. These compounds are used in the proportion of from 5 to 99 wt %, preferably from 10 to 95 wt %, and particularly preferably from 20 to 90 wt %, based on the entire solid content of the thermal positive type image-recording layer. When the addition amount is less than 5 wt %, the durability of the image-recording layer is deteriorated, while when it exceeds 99 wt %, sensitivity and durability are deteriorated.

In addition to the above-described compounds which are transformed into alkali-soluble by heating, a binder is preferably added to the thermal positive type image-recording layer. Urethane resins are exemplified as the binder, and urethane resins having a carboxyl group or a sulfonamido group are preferred above all. That is, the polyurethane resins which are preferably used in the present invention are polyurethane resins having basic skeleton of the reaction product of a diisocyanate compound with a diol compound containing a sulfonamido group having at least one hydrogen atom bonded on the nitrogen atom.

Examples of diisocyanate compounds which are preferably used in the present invention include aromatic diisocyanate compounds, e.g., 2,4-tolylene diisocyanate, dimers of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate, and 3,3'-dimethylbiphenyl-4,4'-diisocyanate; fatty acid diisocyanate compounds, e.g., hexamethylene diisocyanate, trimethylhexamethylene diisocyanate, lysine diisocyanate, and dimer acid diisocyanate; alicyclic diisocyanate compounds, e.g., isophorone diisocyanate, 4,4'-methylenebis(cyclohexyl isocyanate), methylcyclohexane-2,4 (or 2,6)-diisocyanate, and 1,3-(isocyanatemethyl) cyclohexane; and diisocyanate compounds which are the reaction products of the diols, such as the addition products of 1 mol of 1,3-butylene glycol and 2 mols of tolylene diisocyanate, with diisocyanate.

Examples of diol compounds containing a sulfonamido group having at least one hydrogen atom bonded on the nitrogen atom include p-(1,1-dihydroxymethyl-ethylcarbonylamino)benzenesulfonamide, N-ethyl body of p-(1,1-dihydroxymethylethylcarbonylamino) benzenesulfonamide, N-(m-methylsulfonylaminophenyl)-2,2-dihydroxymethylpropanamide, N-(p-methylsulfonylaminophenyl)-2,2-dihydroxymethylpropanamide, N-(m-ethylsulfonylaminophenyl)-2,2-dihydroxymethylpropanamide, N-(p-ethylsulfonylaminophenyl)-2,2-dihydroxymethylpropanamide, N-[2,2-(dihydroxyethylaminocarbonyl)ethyl]methanesulfonamide, N-[2,2-(dihydroxyethylaminocarbonyl)ethyl]benzenesulfonamide, and N-[2,2-(dihydroxyethylaminocarbonyl)ethyl]-p-toluenesulfonamide.

The diol compounds containing these sulfonamido groups may be used alone or they may be used in combination of two or more. Further, diol compounds which do not have a sulfonamido group and may have other substituents which do not react with isocyanate may be used in combination with diol compounds having a sulfonamido group. Examples of such diol compounds include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butyl-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, propylene oxide adduct of hydrogenated bisphenol A, hydroquinone-dihydroxyethyl ether, p-xylylene glycol, dihydroxyethylsulfone, bis(2-hydroxyethyl)-2,4-tolylenedicarbamate, 2,4-tolylene-bis(2-hydroxyethylcarbamide), bis(2-hydroxyethyl)-m-xylylenedicarbamate, bis(2-hydroxyethyl)isophthalate, 3,5-dihydroxybenzoic acid, 2,2-bis(hydroxymethyl)propionic acid, 2,2-bis(hydroxyethyl)propionic acid, 2,2-bis(3-hydroxy-propyl)propionic acid, bis(hydroxymethyl)acetic acid, bis(4-hydroxyphenyl)acetic acid, 4,4-bis(4-hydroxyphenyl)pentanoic acid, and tartaric acid.

A polyurethane resin which can be used in the present invention is synthesized by adding a well-known catalyst of the activity according to respective reactivities to the above diisocyanate compound and the diol compound in a non-protonic solvent and then heating. The molar ratio of the diisocyanate compound and the diol compound is preferably from 0.8/1 to 1.2/1, more preferably from 0.85/1.1 to 1.1/1. When isocyanate groups remain at polymer terminals, the terminals are treated with alcohols or amines, thereby a polyurethane resin having no remaining isocyanate groups at last can be synthesized.

Polyurethane resins which can be used in the present invention have weight average molecular weight of preferably 2,000 or more, more preferably from 5,000 to 300,000, and number average molecular weight of preferably 1,000 or more, more preferably from 2,000 to 250,000. The degree of polydispersion (weight average molecular weight/number average molecular weight) of polyurethane resins is preferably 1 or more, more preferably from 1.1 to 10.

Unreacted monomers may be contained in a binder which can be used in the present invention. In such a case, the proportion of the monomers occupied in a binder is preferably 15 wt % or less. The above-described binders may be used alone or two or more kinds may be used in mixture. Above all, it is preferred to use a novolak resin in mixture with other binders.

Various additives may further be added to the thermal positive type image-recording layer according to the present invention, if necessary. For example, such additives include thermal-decomposable compounds such as onium salts, o-quinonediazide compounds, aromatic sulfone compounds, and aromatic sulfonate compounds. It is preferred to use in combination of a compound which, in the state not being decomposed, substantially lowers the solubility of the high molecular compounds which are transformed into alkali-soluble by heating with a view to improving the inhibition of dissolution of an image area in a developing solution. As such onium salts, a diazonium salt, an ammonium salt, a phosphonium salt, an iodonium salt, a sulfonium salt, a selenonium salt, and an arsonium salt are exemplified.

Examples of preferred onium salts include diazonium salts described in S. I. Schlesinger, *Photogr. Sci. Eng.*, 18, 387 (1974), T. S. Bal et al., *Polymer,* 21, 423 (1980), and JP-A-5-158230; ammonium salts disclosed in U.S. Pat. Nos. 4,069,055, 4,069,056, and JP-A-3-140140; phosphonium salts described in D. C. Necker et al., *Macromolecules,* 17, 2468 (1984), C. S. Wen et al., *Teh, Proc. Conf. Rad. Curing ASIA*, p. 478, Tokyo, Oct (1988), U.S. Pat. Nos. 4,069,055, and 4,069,056; iodonium salts described in J. V. Crivello et al., *Macromolecules,* 10 (6), 1307 (1977), *Chem. & Eng. News*, Nov. 28, p. 31 (1988), EP 104143, U.S. Pat. Nos. 339,049, 410,201, JP-A-2-150848, and JP-A-2-296514; sulfonium salts described in J. V. Crivello et al., *Polymer J.,* 17,73 (1985), J. V. Crivello et al., *J. Org. Chem.,* 43, 3055 (1978), W. R. Watt et al., *J. Polymer Sci.*, Polymer Chem. Ed., 22, 1789 (1984), J. V. Crivello et al., *Polymer Bull.,* 14, 279 (1985), J. V. Crivello et al., *Macromolecules,* 14 (5), 1141 (1981), J. V. Crivello et al., *Polymer Sci.*, Polymer Chem. Ed., 17, 2877 (1979), EP 370693, EP 233567, EP 297443, EP 297442, U.S. Pat. Nos. 4,933,377, 3,902,114, 410,201, 339,049, 4,760,013, 4,734,444, 2,833,827, German Patents 2,904,626, 3,604,580, and 3,604,581; selenonium salts described in J. V. Crivello et al., *Macromolecules,* 10 (6), 1307 (1977), and J. V. Crivello et al., *J. Polymer Sci.,* Polymer Chem. Ed., 17, 1047 (1979); and arsonium salts described in C. S. Wen et al., *Teh, Proc. Conf. Rad. Curing ASIA*, p. 478, Tokyo, October (1988).

Of these, diazonium salts are particularly preferably used in the present invention, and diazonium salts disclosed in JP-A-5-158230 are particularly preferred. Preferred quinonediazide compounds are o-quinonediazide compounds. The o-quinonediazide compounds for use in the present invention are compounds having at least one o-quinonediazido group and whose alkali solubility is increased by thermal decomposition and compounds of various structures can be used. That is, o-quinonediazide loses the function of inhibiting dissolution of an alkali-soluble binder by thermal decomposition and o-quinonediazide per se converts to an alkali-soluble substance, thereby assist the solution of photosensitive materials. o-quinonediazide compounds described in, e.g., J. Kosar, *Light-Sensitive Systems*, pp. 339 to 352, John Wiley & Sons, Inc. can be used in the present invention. Sulfonates or sulfonic acid amides of o-quinonediazide obtained by reaction with various aromatic polyhydroxyl compounds or aromatic amino compounds are particularly preferred. Further, esters of benzoquinone-(1,2)-diazidosulfonic acid chloride or naphthoquinone-(1,2)-diazido-5-sulfonic acid chloride and pyrogallol/acetone resins disclosed in JP-B-43-28403, and esters of benzoquinone-(1,2)-diazidosulfonic acid chloride or naphthoquinone-(1,2)-diazido-5-sulfonic acid chloride and phenol/formaldehyde resins disclosed in U.S. Pat. Nos. 3,046,120 and 3,188,210 are also preferably used.

Further, esters of naphthoquinone-(1,2)-diazido-4-sulfonic acid chloride and phenol/formaldehyde resins or cresol/formaldehyde resins, and esters of naphthoquinone-(1,2)-diazido-4-sulfonic acid chloride and pyrogallol/acetone resins are also preferably used in the present invention. As other useful o-quinonediazide compounds, those disclosed in the following patents can be exemplified: JP-A-47-5303, JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,554,323, 3,573,917, 3,674,495, 3,785,825, British Patents 1,277,602, 1,251,345, 1,267,005, 1,329,888, 1,330,932, and German Patent 854,890.

The addition amount of the o-quinonediazide compounds for use in the present invention is preferably from 1 to 50 wt %, more preferably from 5 to 30 wt %, and particularly preferably from 10 to 30 wt %, based on the entire solid content of the thermal positive type image-recording layer. These compounds can be used alone or they may be used as mixtures of two or more.

As counter ions of onium salts, boric acid tetrafluoride, phosphoric acid hexafluoride, triisopropylnaphthalenesulfonic acid, 5-nitro-o-toluenesulfonic acid, 5-sulfosalicylic acid, 2,5-dimethylbenzenesulfonic acid, 2,4,6-trimethylbenzensulfonic acid, 2-nitrobenzenesulfonic acid, 3-chlorobenzenesulfonic acid, 3-bromobenzene- sulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid, and paratoluenesulfonic acid can be exemplified. Of these, alkyl aromatic sulfonic acid such as phosphoric acid hexafluoride, triisopropylnaphthalenesulfonic acid, and 2,5-dimethylbenzenesulfonic acid are preferred.

The addition amount of the additives other than o-quinonediazide compounds is preferably from 1 to 50 wt %, more preferably from 5 to 30 wt %, and particularly preferably from 10 to 30 wt %, based on the entire solid content of the thermal positive type image-recording layer.

For further improving sensitivity, cyclic acid anhydrides, phenols and organic acids can be used in combination. Examples of cyclic acid anhydrides include, as disclosed in U.S. Pat. No. 4,115,128, phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, $\alpha$-phenylmaleic anhydride, succinic anhydride and pyromellitic anhydride. Examples of phenols include bisphenol A, p-nitrophenol, p-ethoxylphenyl, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane. Further, examples of organic acids include, as are disclosed in JP-A-60-88942 and JP-A-2-96755, sulfonic acids, sulfinic acids, alkylsulfuric acids, phosphonic acids, phosphates, and carboxylic acids, specifically, p-toluenesulfonic acid, dodecylbenzenesulfonic acid, p-toluenesulfinic acid, ethyl sulfuric acid, phenyl phosphonic acid, phenyl phosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid can be exemplified.

The proportion of the above cyclic acid anhydrides, phenols and organic acids in the material of the image-recording layer is preferably from 0.05 to 20 wt %, more preferably from 0.1 to 15 wt %, and most preferably from 0.1 to 10 wt %. Surfactants can be added to the material of the image-recording layer of the present invention for widening the processing stability against development conditions, e.g., nonionic surfactants as disclosed in JP-A-62-251740 and JP-A-3-208514, and ampholytic surfactants as disclosed in JP-A-59-121044 and JP-A-4-13149 can be added.

Specific examples of nonionic surfactants include sorbitan tristearate, sorbitan monopalmitate, sorbitan trioleate, stearic acid monoglyceride, polyoxyethylene-nonylphenyl ether, etc. Specific examples of ampholytic surfactants include alkyldi(aminoethyl)glycine, alkylpolyaminoethylgylcine hydrochloride, 2-alkyl-N-carboxyethyl-N-hydroxyethylimidazolinium betaine, N-tetradecyl-N,N-betaine type surfactants (e.g., Amorgen K, trade name, manufactured by Daiichi Kogyo Seiyaku Co., Ltd.), etc. The content of these nonionic and ampholytic surfactants is preferably from 0.05 to 15 wt %, more preferably from 0.1 to 5 wt %, based on the entire solid content of the thermal positive type image-recording layer.

(d-3) Thermal Negative Type Image-Recording Layer

The thermal negative type image-recording layer contains at least a polymer having a constitutional unit represented by the following formula (IX), a thermal crosslinking agent, and an acid-generating agent, and if necessary, a light/heat converting material described in detail later:

(IX)

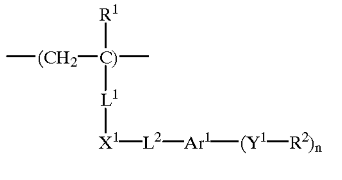

In formula (IX), $R^1$ represents a hydrogen atom or a methyl group; $X^1$ represents a linking group showing alkali solubility per se or a linking group having an alkali-soluble group. An alkali-soluble group used herein means a group containing such a moiety as sulfonic acid amide, sulfonic acid imide or carboxylic acid imide, specifically $-SO_2NH-$, $-NHSO_2-$, $-SO_2NHCO-$, $-CONHSO_2-$, and $-CONHCO-$ can be exemplified. $Ar^1$ represents an aromatic hydrocarbon group having 20 or less carbon atoms which may have a substituent, specifically a benzene ring, a naphthalene ring, an anthracene ring, a phenanthrene ring can be exemplified. Of these aromatic hydrocarbon groups, a benzene ring and a naphthalene ring are preferred because of easy availability and from economical viewpoint.

Preferred examples of the substituents which the aromatic hydrocarbon groups may have include a hydrocarbon group having 20 or less carbon atoms, a halogen atom, a cyano group, a nitro group, a carboxyl group, or a carbamoyl group. $Y^1$ represents N-$R^3$, an oxygen atom or a sulfur atom, $R^2$ represents a hydrocarbon group having 20 or less carbon atoms which may have a substituent, $R^3$ represents a hydrogen atom or a hydrocarbon group having 20 or less carbon atoms which may have a substituent. Preferred examples of the substituents for $R^2$ and $R^3$ include a halogen atom, a cyano group, a nitro group, a carboxyl group, a carbamoyl group, an alkoxyl group having 20 or less carbon atoms, a perfluoroalkyl group having 20 or less carbon atoms, and a hydroxyalkyl group having 20 or less carbon atoms. n represents an integer of from 1 to 4. $L^1$ represents a single bond, an ester bond, a carboxylic acid amide bond, a sulfonic acid amide bond, an ether bond, a thioether bond, or a hydrocarbon group having 20 or less carbon atoms which may have any of these bonds. $L^2$ represents a single bond or a hydrocarbon group having 20 or less carbon atoms, and a single bond is preferred because of easy availability and from economical viewpoint.

Further, $R^2$ and $Ar^1$, $R^3$ and $Ar^1$, and $R^2$ and $R^3$ may form a cyclic structure such as a cyclohexane ring. A polymer having a constitutional unit represented by formula (IX) preferably used in the present invention is a polymer having a constitutional unit represented by the following formula (X). In formula (X), definitions will be omitted as to those having the same symbols as in formula (IX).

(X)

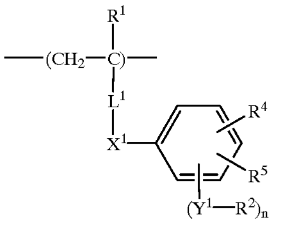

In formula (X), $R^4$ and $R^5$, which may be the same or different, each represents a hydrogen atom or a hydrocarbon group having 20 or less carbon atoms which may have a substituent. Preferred examples of the substituents for $R^4$ and $R^5$ include a halogen atom, a cyano group, a nitro group, a carboxyl group, a carbamoyl group, an alkoxyl group having 20 or less carbon atoms, a perfluoroalkyl group having 20 or less carbon atoms, and a hydroxyalkyl group having 20 or less carbon atoms. $R^4$ and $R^5$ may form a cyclic structure such as a condensed benzene ring or a cyclohexane ring. A polymer having the constitutional unit represented by formula (X) uses a monomer represented by corresponding formula (XI) and can be obtained by radical polymerization according to conventionally known methods. In formula (XI), definitions will be omitted as to those having the same symbols as in formula (X).
(XI)
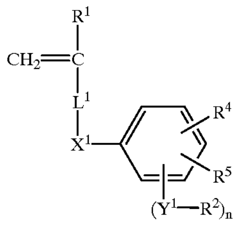
Specific examples (XI-1) to (XI-13) of the monomer represented by formula (XI) preferably used in the present invention will be shown below. In the following formulae, $R^1$ represents a methyl group and $Z^1$ represents an oxygen atom or NH.
(Xl-1)
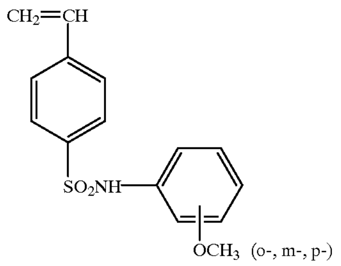
(Xl-2)
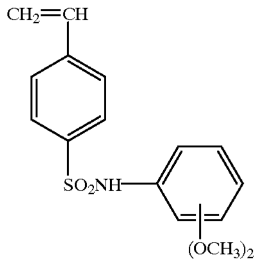
(Xl-3)
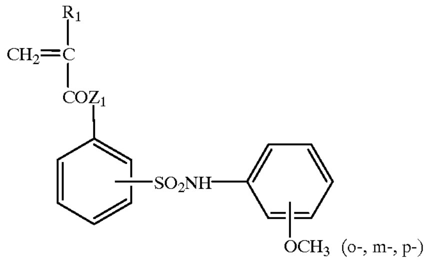
(Xl-4)
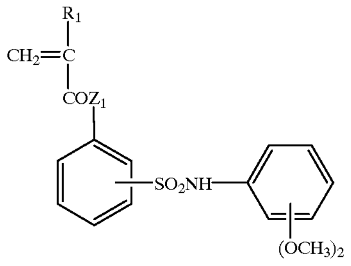
-continued
(Xl-5)
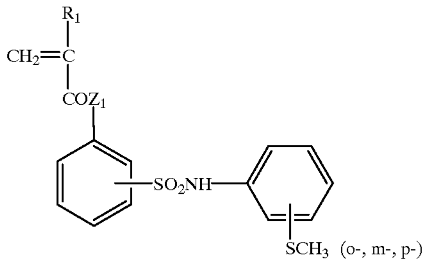
(Xl-6)
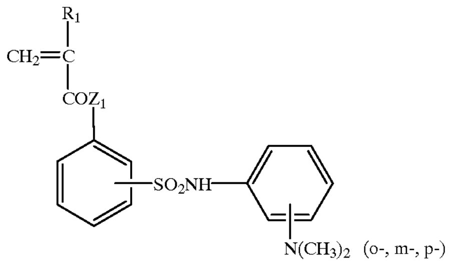
(Xl-7)
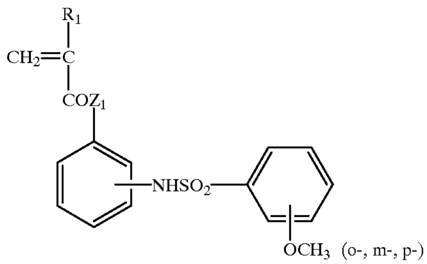
(Xl-8)
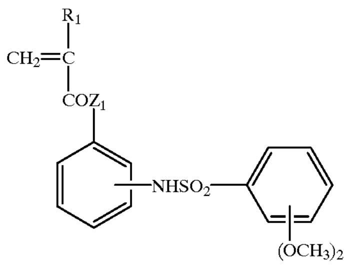
(Xl-9)
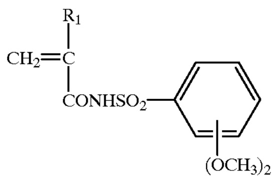
(Xl-10)
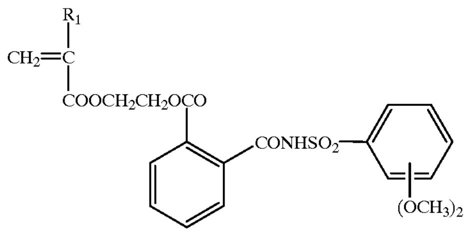

-continued (XI-11)

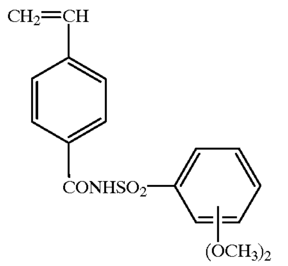

(XI-12)

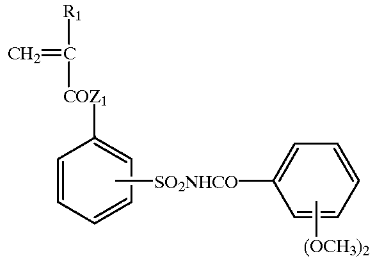

(XI-13)

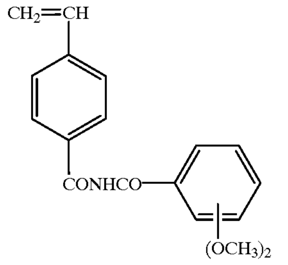

In the present invention, as preferred polymers having the constitutional unit represented by formula (IX), either a homopolymer comprising the monomer represented by formula (XI) alone or copolymers comprising two or more monomers may be used. In the present invention, it is preferred to use copolymers comprising the monomer represented by formula (XI) and conventionally well-known polymerizable monomers other than the monomer represented by formula (XI) from the viewpoint of the solubility in a coating solution and the flexibility of the film.

As well-known monomers for use in combination with the monomer represented by formula (XI), acrylates, e.g., methyl acrylate, ethyl acrylate, propyl acrylate, butyl acrylate, 2-ethylhexyl acrylate, cyclohexyl acrylate, 2-hydroxyethyl acrylate, and benzyl acrylate, methacrylate, e.g., methyl methacrylate, ethyl methacrylate, propyl methacrylate, butyl methacrylate, 2-ethylhexyl methacrylate, cyclohexyl methacrylate, 2-hydroxyethyl methacrylate, and benzyl methacrylate, and acrylonitrile can be exemplified.

The polymer having the constitutional unit represented by formula (IX) according to the present invention has $X^1$, which is a linking group showing alkali solubility (e.g., an acid group, etc.), as the partial structure, therefore, excellent in the solubility in alkali water, and the polymer may be a copolymer using a monomer having other acid group as assistant. Examples of such monomers include acrylic acid, methacrylic acid, itaconic acid, maleic acid, N-(2-carboxyethyl)acrylamide, N-(2-carboxyethyl) methacrylamide, N-(carboxyphenyl)acrylamide, N-(carboxyphenyl)methacrylamide, carboxystyrene, maleimide, N-(phenylsulfonyl)acrylamide, N-(phenylsulfonyl)methacrylamide, N-(tolylsulfonyl) acrylamide, N-(tolylsulfonyl)methacrylamide, N-(chlorophenylsulfonyl)acrylamide, N-(chlorophenylsulfonyl)methacrylamide, N-(sulfamoylphenyl) acrylamide, N-(sulfamoylphenyl)methacrylamide, N-(methylsulfamoylphenyl)acrylamide, N-(methylsulfamoylphenyl)methacrylamide, N-(phenylsulfamoylphenyl)acrylamide, N-(phenylsulfamoylphenyl) methacrylamide, N-(tolylsulfamoylphenyl)acrylamide, N-(tolylsulfamoylphenyl)methacrylamide, N-[(chlorophenylsulfamoyl)phenyl]acrylamide, N-[(chlorophenylsulfamoyl)phenyl]methacrylamide, N-(hydroxyphenyl)acrylamide, N-(hydroxyphenyl)methacrylamide, N-(hydroxynaphthyl)acrylamide, and N-(hydroxynaphthyl) methacrylamide.

Although they are not acid groups, the monomers containing salts of strong acids such as sodium salt of p-styrenesulfonic acid, alkali metal salt of 2-acrylamide-2-methylpropanesulfonic acid, tetraalkylammonium salt, or potassium salt of 3-sulfopropyl acrylate can improve the solubility in water, as a result, the developing property in an aqueous developing solution of the image-recording layer material can be improved. Accordingly, these compounds are preferred as the constitutional component of the copolymers for use in the thermal negative type image-recording layer.

The proportion of the constitutional unit represented by formula (IX) contained in the copolymers using these monomers is preferably from 20 to 95 wt %, more preferably from 30 to 90 wt %. Further, the weight average molecular weight of the polymers having the constitutional unit represented by formula (IX) contained in the thermal negative type image-recording layer is preferably 5,000 or more, more preferably from 10,000 to 300,000, and the number average molecular weight is preferably 1,000 or more, more preferably from 2,000 to 250,000. The degree of polydispersion (weight average molecular weight/number average molecular weight) of the polymers is preferably 1 or more, more preferably from 1.1 to 10. These polymers maybe random polymers, block polymers or graft polymers, but preferably random polymers.

In synthesizing the polymer having the constitutional unit represented by formula (IX), the following solvents can be used alone or in combination of two or more thereof, e.g., tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, and water. As radical polymerization initiators in synthesis, well-known initiators such as azo initiators and peroxide initiators can be used. The polymer having the constitutional unit represented by formula (IX) may be used alone or in mixture, and the proportion of the polymer is from 20 to 95 wt %, preferably from 40 to 90 wt %, based on the entire solid content of the thermal negative type image-recording layer. When the addition amount is less than 20 wt %, the strength of the image area formed is insufficient, and when the addition amount exceeds 95 wt %, an image cannot be formed.

As the thermal crosslinking agents for use in the thermal negative type image-recording layer, compounds having two or more hydroxymethyl groups, alkoxymethyl groups, epoxy groups or vinyl ether groups in the molecule are exemplified. Compounds having such crosslinking functional groups directly bonded to aromatic rings are preferred. Specifically, methylolmelamine, resol resins, epoxidized novolak resin, and urea-formaldehyde resins can be exemplified. The compounds described in Shinzo Yamashita and Tosuke Kaneko, *Kakyozai Handbook* (*Handbook of Crosslinking Agents*), Taiseisha Co. Ltd. are also preferably used in the present invention. In particular, phenol derivatives having two or more hydroxymethyl groups or alkoxymethyl groups in the molecule are preferred because an image area having good strength can be formed. Specifically, resol resins can be exemplified as such phenol derivatives. However, these thermal crosslinking agents are unstable to heat and the stability during storage after formation of the image-recording material is inferior. Contrary to this, a phenol derivative having from four to eight benzene nuclei in the molecule, at least one phenolic hydroxyl group, and at least two groups represented by formula (XII) is excellent in storage stability and most preferably used in the present invention:

$$—CH_2OR^6 \qquad (XII)$$

In formula (XII), $R^6$ represents a hydrogen atom, an alkyl group or an acyl group. As the alkyl group, e.g., an alkyl group having from 1 to 4 carbon atoms such as methyl, ethyl, n-propyl, isopropyl, n-butyl, isobutyl, sec-butyl and t-butyl, and as the acyl group, e.g., formyl, acetyl, butyryl, benzoyl, cinnamoyl, and valeryl are preferred. In addition, a substituted alkyl group having from 1 to 4 carbon atoms, e.g., methoxyethyl, methoxypropyl, hydroxyethyl, and hydroxypropyl, can be used.

A phenol derivative which can be used in the thermal negative type image-recording layer can be obtained by reacting a well-known phenol compound with formaldehyde. For example, by the reaction of well-known phenol compounds, e.g., phenol compounds disclosed in JP-A-1-289946, JP-A-3-179353, JP-A-3-200252, JP-A-3-128959, JP-A-3-200254, JP-A-5-158233, and JP-A-5-224409 with formaldehyde in a strong alkaline atmosphere for about 0 to 80° C., preferably from 10 to 60° C. for 1 to 30 hours, a phenol derivative wherein $R^6$ in formula (XII) represents a hydrogen atom can be obtained.

By further continuing the reaction thereafter under an acidic condition with an alcohol having from 1 to 4 carbon atoms, a substituted alcohol, acid halide or acid anhydride at 0 to 80° C. for 1 to 30 hours, a phenol derivative wherein $R^6$ in formula (XII) represents an alkyl group or an acyl group can be obtained. The temperature of the reaction with alcohol and a substituted alcohol is preferably from 20 to 80° C., and the temperature of the reaction with acid halide or acid anhydride is preferably from 0 to 30° C. As the specific examples of the phenol derivatives which are usable in the present invention, the compounds represented by the following formulae (XIII) to (XX) can be exemplified, but it should not be construed as the present invention is limited thereto. These phenol derivatives may be used alone or in combination of two or more, and the addition amount is from 0.2 to 60 wt %, preferably from 0.5 to 20 wt %, based on the content of the thermal negative type image-recording layer. Further, compounds having from one to three benzene nuclei, a phenolic hydroxyl group and a group represented by formula (XII) bring about the deterioration of ink adhering property (i.e., inking property) and the lowering of development latitude, therefore, it is preferred that the thermal negative type image-recording layer substantially does not contain such compounds. Specifically, the content of such compounds in the thermal negative type image-recording layer is preferably 5 wt % or less, more preferably 3 wt % or less, and most preferably 0 wt %.

(XIII)

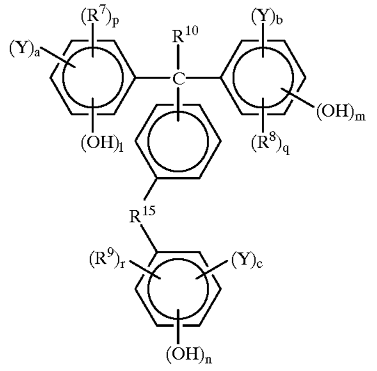

(XIV)

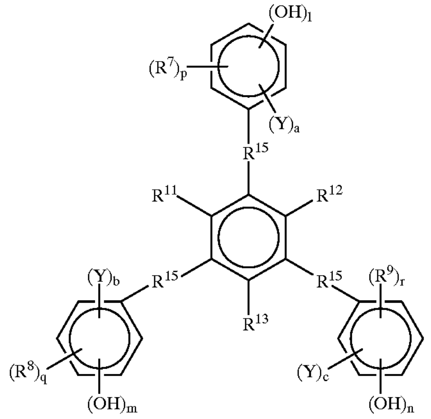

(XV)

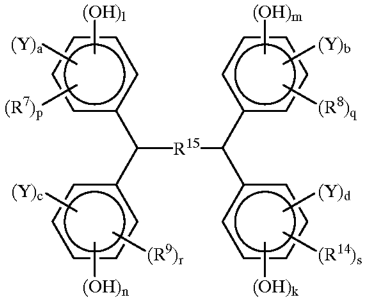

(XVI)

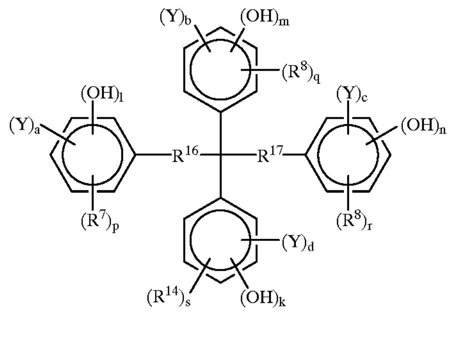

-continued (XVII)

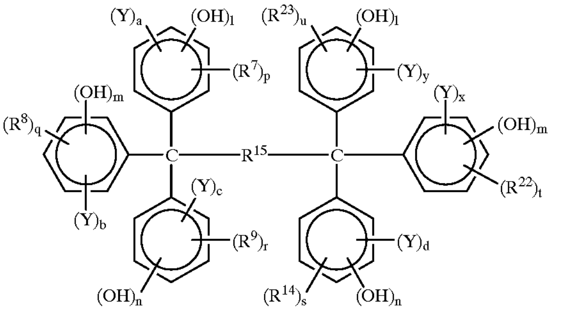

(XVIII)

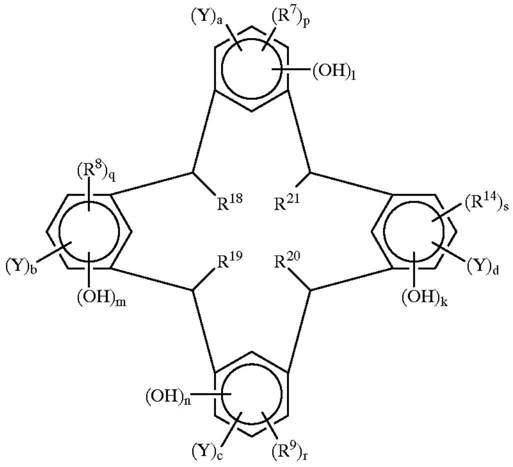

(XIX)

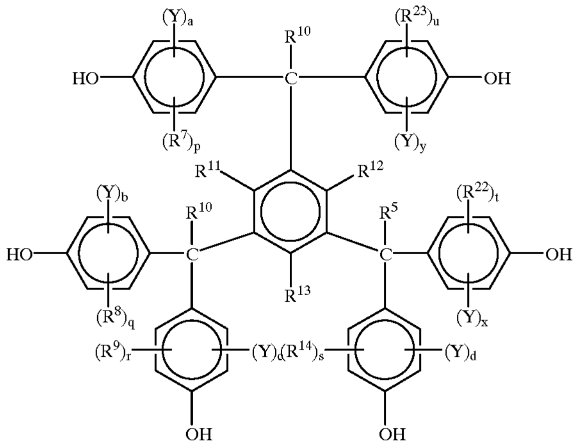

-continued (XX)

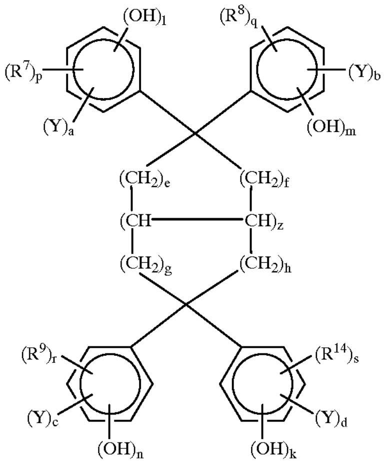

In the above formulae, $R^7$, $R^8$, $R^9$, $R^{14}$, $R^{22}$ and $R^{23}$ each represents a hydrogen atom, a halogen atom, an alkyl group or an alkoxyl group; $R^{10}$, $R^{18}$, $R^{19}$, $R^{20}$ and $R^{21}$ each represents a hydrogen atom or an alkyl group; $R^{11}$, $R^{12}$ and $R^{13}$ each represents a hydrogen atom, a halogen atom, or an alkyl group; $R^{15}$, $R^{16}$ and $R^{17}$ each represents a single bond, a substituted or unsubstituted alkylene group, alkenylene group, phenylene group, naphthylene group, carbonyl group, ether group, thioether group, amido bond, or a combination of two or more of them; Y represents a group represented by formula (XII); a, b, c, d, x and y each represents an integer of from 0 to 3, provided that a+b+c+d+x+y is an integer of from 2 to 16; k, l, m and n each represents an integer of from 0 to 3, provided that k, l, m and n do not represents 0 at the same time; e, f, g, h, p, q, r, s, t and u each represents an integer of from 0 to 3; and z represents 0 or 1. Specific examples of the compounds represented by formulae (XIII) to (XX) are shown below.

(XXI)

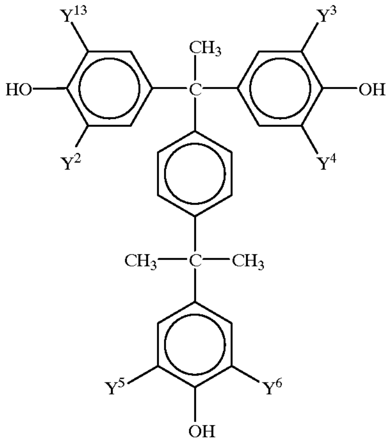

-continued
(XXII)
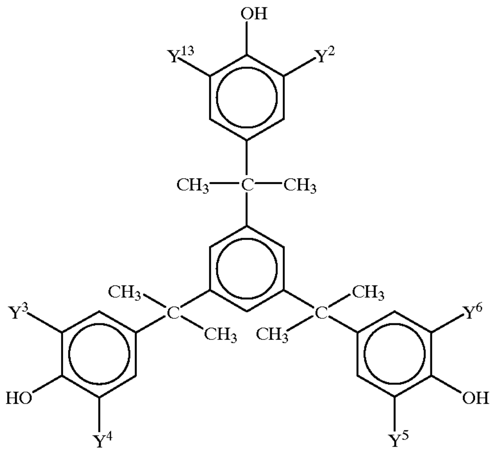
(XXIII)
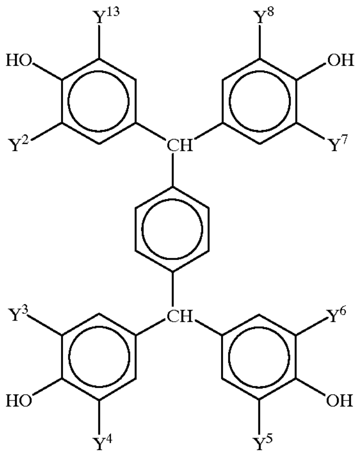
(XXIV)
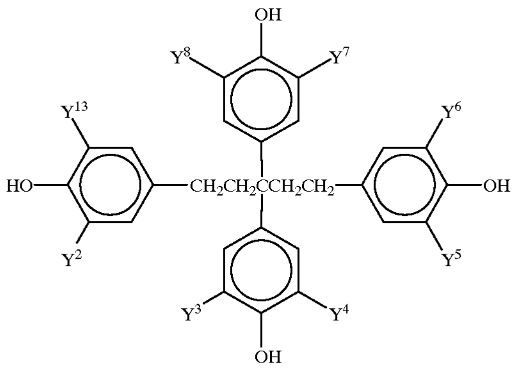
-continued
(XXV)
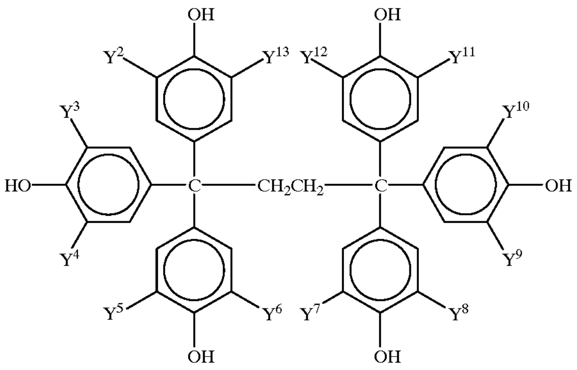
(XXVI)
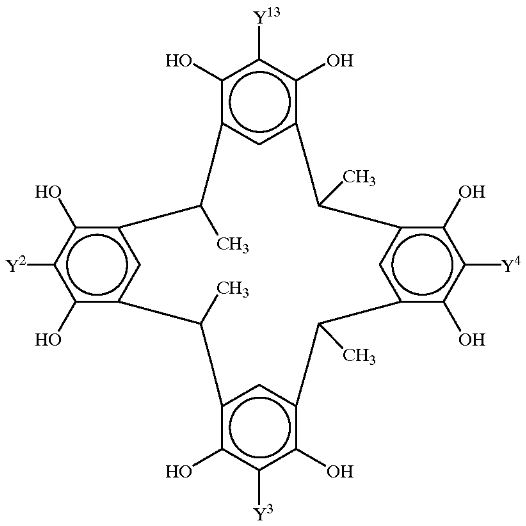
(XXVII)
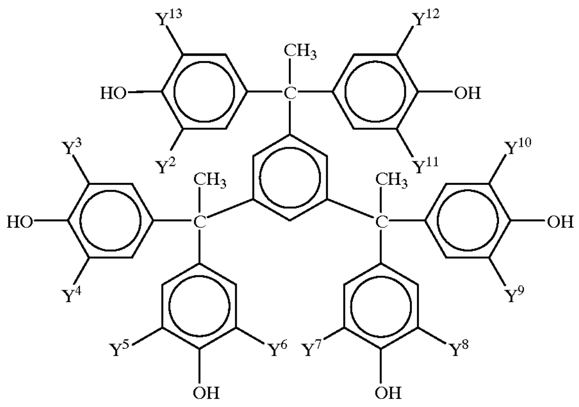

-continued (XXVIII)

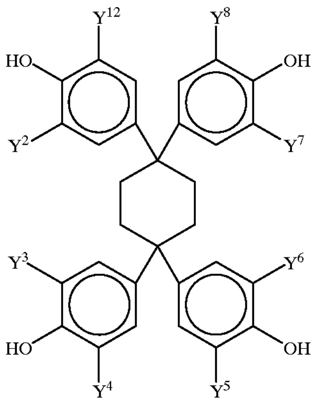

In the above formulae, $Y^2$, $Y^3$, $Y^4$, $Y^5$, $Y^6$, $Y^7$, $Y^8$, $Y^9$, $Y^{10}$, $Y^{11}$, $Y^{12}$ and $Y^{13}$ each represents a hydrogen atom or a group represented by formula (XII), but at least two represent a group represented by formula (XII) in each compound, preferably all of $Y^2$ to $Y^{13}$ represent a group represented by formula (XII). Aldehyde and ketone compounds can be exemplified as other thermal crosslinking agents preferably used in the present invention. Preferred compounds are those having two or more aldehydes or ketones in the molecule. These thermal crosslinking agents may be used alone or in combination of two or more, and the addition amount of the thermal crosslinking agents is from 5 to 70 wt %, preferably from 10 to 65 wt %, based on the entire solid content of the thermal negative type image-recording layer. When the addition amount of the thermal crosslinking agents is less than 5 wt %, the film strength of the image area when an image is recorded is deteriorated, while when it exceeds 70 wt %, the storage stability cannot be ensured.

Further, an acid-generating agent is added to the thermal negative type image-recording layer. An acid-generating agent is a compound which is decomposed by light or heating of 100° C. or more and generates an acid. Acids to be generated are preferably strong acids having pKa of 2 or less, e.g., a sulfonic acid and a hydrochloric acid. As the acid-generating agents which can be preferably used in the present invention, onium salts such as an iodonium salt, a sulfonium salt, a phosphonium salt, and a diazonium salt can be exemplified. Specifically, the compounds disclosed in U.S. Pat. No. 4,708,925 and JP-A-7-20629 can be used in the present invention. Iodonium salts, sulfonium salts and diazonium salts having a sulfonic acid ion as a counter ion are particularly preferred.

As diazonium salts, the diazonium compounds disclosed in U.S. Pat. Nos. 3,867,147 and 2,632,703, and the diazo resins disclosed in JP-A-1-102456 and JP-A-1-102457 are preferred. The benzyl sulfonates disclosed in U.S. Pat. Nos. 5,135,838 and 5,200,544, are also preferred. Further, the active sulfonates and disulfonyl compounds disclosed in JP-A-2-100054, JP-A-2-100055 and JP-A-9-197671 are also preferred. In addition, the haloalkyl-substituted s-triazines disclosed in JP-A-7-271029 are also preferred.

These compounds may be used alone or may be used in combination of two or more. The proportion of these compounds is from 0.01 to 50 wt %, preferably from 0.1 to 25 wt %, and more preferably from 0.5 to 15 wt %, based on the entire solid content of the thermal negative type image-recording layer. When the addition amount is less than 0.01 wt %, an image cannot be obtained, while when it exceeds 50 wt %, staining is generated on the non-image area at printing.

Various additives can be added to the thermal negative type image-recording layer, if necessary. For example, polyfunctional monomers having two or more radical polymerizable ethylenical double bonds in the molecule can be added. As such compounds, ethylene glycol di(meth)acrylate, diethylene glycol di(meth)acrylate, polyethylene glycol di(meth)acrylate, hexanediol di(meth)acrylate, trimethylolethane tri(meth)acrylate, trimethylolpropane tri(meth)acrylate, tri-, tetra- or hexa(meth)acrylate of pentaerythritol and dipentaerythritol can be exemplified. The addition amount of these polyfunctional monomers is 30 wt % or less in the thermal negative type image-recording layer.

To the thermal positive type image-recording layer and the thermal negative type image-recording layer described in detail above may be added in common light/heat converting materials for converting light such as laser beams to heat, printing out agents for obtaining visible images immediately after exposure, dyes and pigments as coloring agents for coloring images, and plasticizers for giving flexibility to the image-recording layer.

As light/heat converting materials, various pigments and dyes can be used in the present invention. As such pigments, those commercially available pigments and pigments described in *Color Index* (*C.I.*), *Shaishin Ganryo Binran* (*The Latest Pigment Handbook*), compiled by Nihon Ganryo Gijutsu Kyokai (1977), *Shaishin Ganryo Oyo Gijutsu* (*The Latest Pigment Applied Technique*), published by CMC Publishing Co. Ltd. (1986), *Insatsu Ink Gijutsu* (*Printing Ink Technique*), CMC Publishing Co. Ltd. (1984) can be used.

Various kinds of pigments can be used, e.g., black pigments, yellow pigments, orange pigments, brown pigments, red pigments, purple pigments, blue pigments, green pigments, fluorescent pigments, metallic powder pigments, and polymer-attaching pigments can be exemplified. Specifically, insoluble azo pigments, azo lake pigments, condensation azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, in-mold lake pigments, azine pigments, nitroso pigments, nitro pigments, natural pigments, fluorescent pigments, inorganic pigments, and carbon black can be used.

These pigments may be used without surface treatment or may be surface-treated. As methods of surface treatments, a method of surface-coating with resins and waxes, a method of adhering surfactants, and a method of attaching reactive substances (e.g., silane coupling agents, epoxy compounds, polyisocyanate, etc.) on the surfaces of pigments can be exemplified. These surface treatment methods are described in *Kinzoku Sekken no Seishitsu to Oyo* (*Natures and Applications of Metal Soaps*), Saiwai Shobo Co., Ltd., *Insatsu Ink Gijutsu* (*Printing Ink Technique*), CMC Publishing Co., Ltd. (1984), and *Shaishin Ganryo Oyo Gijutsu* (*The Latest Pigment Applied Technique*), CMC Publishing Co., Ltd. (1986).

The particle size of pigments is preferably from 0.01 to 10 μm, more preferably from 0.05 to 1 μm, and particularly preferably from 0.1 to 1 μm. If the particle size of pigments is less than 0.1 μm, it is not preferred from the viewpoint of the stability of the dispersion in an image-recording layer-coating solution, while when it exceeds 10 μm, it is not preferred in view of the uniformity of the image-recording layer-coating. Well-know dispersing methods used in the manufacture of inks and toners can be used as dispersing methods of pigments. Examples of dispersing apparatus include an ultrasonic disperser, a sand mill, an attritor, a pearl mill, a super-mill, a ball mill, an impeller, a disperser, a KD mill, a colloid mill, a dynatron, a three-roll mill, a pressure kneader, etc., and details are described in *Shaishin Ganryo Oyo Gijutsu* (*The Latest Pigment Applied Technique*), CMC Publishing Co., Ltd. (1986).

As dyes for this purpose, those commercially available and well-known dyes described, for example, in *Senryo Binran* (*Dye Handbook*), compiled by Yuki Gosei Kagaku Kyokai (1970) can be utilized. Specifically, azo dyes, metal complex azo dyes, pyrazolone azo dyes, anthraquinone dyes, phthalocyanine dyes, carbonium dyes, quinoneimine dyes, methine dyes, and cyanine dyes can be used. Of these pigments and dyes, those which absorb infrared rays or near infrared rays are particularly preferably used in the laser which emits infrared rays or near infrared rays.

As such pigments which absorb infrared rays or near infrared rays, carbon blacks are preferably used. Further, as dyes which absorb infrared rays or near infrared rays, e.g., cyanine dyes disclosed in JP-A-58-125246, JP-A-59-84356, JP-A-59-202829, and JP-A-60-78787, methine dyes disclosed in JP-A-58-173696, JP-A-58-181690, and JP-A-58-194595, naphthoquinone dyes disclosed in JP-A-58-112793, JP-A-58-224793, JP-A-59-48187, JP-A-59-73996, JP-A-60-52940, and JP-A-60-63744, squarylium dyes disclosed in JP-A-58-112792, and cyanine dyes disclosed in British Patent 434,875 can be exemplified.

Further, near infrared-absorbing sensitizing dyes disclosed in U.S. Pat. No. 5,156,938 are also preferably used. In addition, substituted arylbenzo(thio)pyrylium salts disclosed in U.S. Pat. No. 3,881,924, trimethine thiapyrylium salts disclosed in JP-A-57-142645 (corresponding to U.S. Pat. No. 4,327,169), pyrylium based compounds disclosed in JP-A-58-181051, JP-A-58-220143, JP-A-59-41363, JP-A-59-84248, JP-A-59-84249, JP-A-59-146063, and JP-A-59-146061, cyanine dyes disclosed in JP-A-59-216146, pentamethine thiopyrylium salts disclosed in U.S. Pat. No. 4,283,475, pyrylium compounds disclosed in JP-B-5-13514 and JP-B-5-19702, Epolight III-178, Epolight III-130, and Epolight III-125 (manufactured by Epolin Co., Ltd.) are particularly preferably used.

As another example of particularly preferred dyes, near infrared-absorbing dyes disclosed in U.S. Pat. No. 4,756,993 as formulae (I) and (II) can be exemplified. These pigments or dyes can be added to the image-recording layer in an amount of from 0.01 to 50 wt %, preferably from 0.1 to 10 wt %, based on the entire solid content of the image-recording layer, and in the case of dyes, particularly preferably the amount of from 0.5 to 10 wt % and in the case of pigments, particularly preferably the amount of from 3.1 to 10 wt %, can be added to the image-recording layer. If the addition amount of pigments or dyes is less than 0.01 wt %, the sensitivity lowers, and when it exceeds 50 wt %, the uniformity of the photosensitive layer is lost and the durability of the recording layer is deteriorated.

As the printing out agent, combinations of the compounds which release an acid upon heating by exposure (light-acid releasing agents) with the organic dyes which can form a salt can be exemplified as representatives. Specifically, combinations of o-naphthoquinonediazide-4-sulfonic acid halogenide with salt-forming organic dyes disclosed in JP-A-50-36209 and JP-A-53-8128, and trihalomethyl compounds with salt-forming organic dyes disclosed in JP-A-53-36223, JP-A-54-74728, JP-A-60-3626, JP-A-61-143748, JP-A-61-151644 and JP-A-63-58440 can be exemplified. As such trihalomethyl compounds, there are oxazole compounds and triazine compounds and both are excellent in aging stability (i.e., storage stability) and clear printing out image can be obtained.

As coloring agents of the image, other dyes can be used besides the above-described salt-forming organic dyes. Oil-soluble dyes and basic dyes can be exemplified as appropriate dyes including the salt-forming organic dyes. Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Kagaku Kogyo Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), and Methylene Blue (C.I. 52015) can be exemplified. Further, dyes disclosed in JP-A-62-293247 are particularly preferably used as coloring agents of the image. These dyes can be added to the image-recording layer in an amount of from 0.01 to 10 wt %, preferably from 0.1 to 3 wt %, based on the entire solid content of the image-recording layer.

As plasticizers, e.g., butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid, etc., can be used.

The above-described ablation type image-recording layer comprising organic substances, the thermal positive type image-recording layer and the thermal negative type image-recording layer are in general manufactured by dissolving each component in a solvent and coating the coating solution on the metal layer having a hydrophilic surface.

Examples of solvents used herein include ethylene dichloride, cyclohexanone, methyl ethyl ketone, methanol, ethanol, propanol, ethylene glycol monomethyl ether, 1-methoxy-2-propanol, 2-methoxyethylacetate, 1-methoxy-2-propylacetate, dimethoxyethane, methyl lactate, ethyl lactate, N,N-dimethylacetamide, N,N-dimethylformamide, tetramethylurea, N-methylpyrrolidone, dimethyl sulfoxide, sulforane, γ-butyrolactone, toluene, etc., but solvents are not limited thereto.

These solvents are used alone or as mixture. The concentration of the above components (entire solid content inclusive of additives) in a solvent is preferably from 1 to 50 wt %. The coating amount on the support obtained after coating and drying (solid content) is varied according to purposes, but it is, in general, preferably from 0.5 to 5.0 $g/m^2$ as to the a lithographic printing plate precursor.

Surfactants, e.g., fluorine surfactants disclosed in JP-A-62-170950 can be added to the coating solution for improving the coating property. Addition amount is preferably from 0.01 to 1 wt %, more preferably from 0.05 to 0.5 wt %, based on the content of the image-recording layer.

Various coating methods can be used, e.g., bar coating, rotary coating, spray coating, curtain coating, dip coating, air knife coating, blade coating, and roll coating can be used.

Plate-Making Method

The plate-making method of the a lithographic printing plate precursor will be described below. The above-described lithographic printing plate precursor having a heat-sensitive type image-recording layer can be subjected to direct imagewise heat-sensitive recording by means of a thermal recording head, etc., and image exposure by means of a solid state laser, a semiconductor laser or an infrared lamp emitting infrared rays of the wavelength of from 760 to 1,200 nm, or high intensity ultraviolet ray or visible ray flash exposure by a xenon electric discharge lamp.

Writing of images may be any of areal exposure system and scanning system. The former case is infrared ray irradiation system, or the system of irradiating the printing plate precursor with xenon electric discharge lamp of high illumination intensity for a short time period and generating heat by light/heat conversion. When a areal exposure light source such as an infrared lamp is used, preferred exposure amount varies by the illumination intensity but generally areal exposure intensity before being modulated by images for printing is preferably from 0.1 to 10 J/cm$^2$, more preferably from 0.3 to 1 J/cm$^2$.

In the latter case, scanning is performed on the printing plate precursor using laser light sources containing a large amount of infrared ray components with modulating the laser beams by printing images. Examples of laser light sources include a semiconductor laser, a helium-neon laser, a helium-cadmium laser, and a YAG laser. It is preferred to perform irradiation with laser beams having peak output of 1,000 W, preferably 2,000 W. In this case, exposure amount is preferably in areal exposure intensity before modulation by images for printing of from 0.1 to 10 J/cm$^2$, preferably from 0.3 to 1 J/cm$^2$.

The imagewise exposed lithographic printing plate precursor having a thermal positive type image-recording layer and a thermal negative type image-recording layer is subjected to water development and, if necessary, gumming, and mounted on a printer and printing can be performed. The lithographic printing plate precursor can be mounted on a printing press immediately after exposure without being subjected to development and printing can be performed. In this case, the heated part or exposed part is swollen by a fountain solution, etc., and the swollen part is removed at initial time of printing, thus a lithographic printing plate is formed. That is, in the plate-making method using the lithographic printing plate precursor according to the present invention, a lithographic printing plate can be formed without particularly subjecting to developing treatment. "Water development" used herein means development with water or a developing solution having pH 2 or more with water as a main component.

When water development is performed or even when developing treatment is omitted, heating treatment after exposure is preferred from the viewpoint of improving sensitivity at recording. Heating is preferably performed at 80 to 150° C. for 10 seconds to 5 minutes. That is, the laser energy necessary for recording can be reduced at laser irradiation by the heating treatment.

The lithographic printing plate precursor obtained through these treatments is set in an offset printing press after water development or without developing step and used for printing of a large number of sheets.

AFM (Atomic Force Microscope) used in the measurement in the present invention was Model SP13700 (manufactured by Seiko Electronic Industries Co., Ltd.). An aluminum plate sample cut to a size of 1 cm square was set on a horizontal sample table on a piezo-scanner, a cantilever was approached to the surface of the sample, and when the cantilever reached the region where AFM works, the sample was scanned in the X and Y directions. At that time, concavities and convexities of the sample were caught by the displacement of the piezo-scanner in the Z direction. Piezo-scanners having the resolution in X/Y direction: 150 μm and Z direction: 10 μm was used. The cantilever used was SI-DF20 (manufactured by NANOPROBE Co.) having resonance frequency of 120–50 KHz, spring constant of 12–20 N/m, and measurement was conducted in DFM mode (Dynamic Force Mode). Datum level was obtained by replenishing for a trace of gradient of the sample by the least square approximation of the obtained three dimensional data.

In the measurement of undulation, average surface roughness and the degree of gradient of high wave, measured area was four-fields of 120 μm square, i.e., 240 μm square. Resolution in X/Y direction was 1.9 μm, Z direction was 1 nm, and scanning speed was 60 μm/sec. The pitch of the undulation of high wave was calculated by the frequency analysis of three dimensional data. Central line average surface roughness (Ra) defined in JIS B0601-94 was extended to three dimensions and taken as the average surface roughness. Adjacent three points were extracted from three dimensional data and the angle formed by a minute triangle formed by the three points and datum level was calculated with all the data, and a gradient degree distribution curve was obtained. With respect to the surface gradient, the rate of 30° or more was searched for from the gradient degree distribution curve.

EXAMPLE

The present invention will be described in detail below with reference to the examples, but the present invention should not be construed as being limited thereto.

Example 1

Ablation Type

Preparation of Lithographic Printing Plate Precursor Support

An aluminum plate (Al), a metal support, having a thickness of 0.2 mm was dipped in sodium hydroxide (NaOH: 26 wt %, Al: 6.5 wt %, 70° C.) for about 5 seconds for degreasing treatment. Al was then dipped in an aqueous solution containing 30 wt % of sulfuric acid at 60° C. for 10 seconds for removing aluminum hydroxide formed on the surface at etching, and thoroughly dried. As a heat-insulating layer, PET having a thickness of 6.5 μm was adhered to Al having a thickness of 0.2 mm with an α-cyanoacrylate adhesive (trade name: 3000DXF, manufactured by Cemedain Co., Ltd.). Subsequently, as a metal layer, Al foil (plate or sheet) having a thickness of 6.5 μm was adhered on the above PET with an α-cyanoacrylate adhesive (trade name: 3000DXF, manufactured by Cemedain Co., Ltd.). As a result of measuring a thickness of Al support, Al foil (plate or sheet), PET and total layer at ten points with a micrometer, the thickness of the adhesive was calculated as 1 μm on average and the standard deviation was 0.8 μm. The thickness of the heat-insulating layer was 8.5 μm from the adding up of the adhesive thickness on Al foil (plate or sheet) side (1 μm), the PET thickness (6.5 μm), and the adhesive thickness on Al support side (1 μm). Alaminator (TOLAMI DX-700) was used in the adhesion.

Adjusting Method and Measuring Method of Metal Layer (Al Foil (Plate or Sheet)) Thickness A tape (NITTO Danpron Tape) for preventing dissolution-etching was stuck on the back side surface of the metal support and the tape was removed off (i.e., peeled off) after etching was finished. Dissolution-etching was performed with sodium hydroxide (NaOH: 26 wt %, Al: 6.5 wt %, 70° C.) and dipping time was adjusted so that the thickness of Al foil (plate or sheet) became 1 μm (43 seconds). Subsequently, Al foil (plate or sheet) was dipped in a 30 wt % aqueous solution of sulfuric acid at 60° C. for 10 seconds for removing aluminum hydroxide formed on the surface at etching. As a result of calculating the etching thickness from the change in weight of Al foil (plate or sheet) before and after etching, the etching thickness was 1 μm. The thicknesses of Al foil (plate or sheet) before and after etching were measured at ten points with a micrometer to calculate the thickness of Al foil (plate or sheet), the thickness of Al foil (plate or sheet) was 1 $\mu$m on average and the standard deviation was 0.8 $\mu$m. Further, for the sake of confirmation, a cross section was produced by a microtome and observed with an SEM. The average thicknesses was 1 $\mu$m and the standard deviation was 0.5 $\mu$m from the observation at ten points.

Formation of Ablation Type Image-recording Layer

The coating solution having the following prescription A was coated on a support by an appropriate coating bar, and dried in an oven at 120° C. for 1 minute, thereby an ablation type image-recording layer was formed. As a result of measuring the thicknesses before and after coating the coating solution at ten points with a micrometer, the thickness of the ablation type image-recording layer (prescription A) was 1 $\mu$m on average and the standard deviation was 0.8 $\mu$m. The thickness obtained from the weight change before and after coating of the coating solution and specific gravity was 1 $\mu$m.

Prescription A

Five (5) mg of a behenic acid, 41 mg of PMMA (Aldorich, average molecular weight: 996,000 (GPC)), and 8 mg of Cyabsorb IR-165 (manufactured by American Cyanamid) were dissolved in 13 ml of a chloroform, thereby a coating solution was prepared.

Measuring Method of Heat Conductivity

As the heat conductivity of PET having a thickness of 6.5 $\mu$m (Mylar film) could not be measured because the thickness was too thin, PET having a thickness of 100 $\mu$m was measured. Measuring instruments QTM-500 and SOFT-QTM5 (manufactured by Kyoto Denshi Kogyo Co., Ltd.) were used for measurement. The result obtained was 0.34 [W/(m·K)].

Laser Irradiation Conditions

The laser irradiation conditions were as follows: continuous oscillation YAG laser (wavelength: 1.064 $\mu$m) was used, maximum output of laser beams was 0.724 W, scanning rate was 120 cm/sec., and $1/e^2$ beam diameter was 35 $\mu$m (as the beam profile showed good Gaussian distribution, approximation was conducted by Gaussian distribution and the position of $1/e^2$ laser output of the maximum strength of the peak was taken as beam diameter).

Writing was performed with varying laser output and line breadth (i.e., line width) at non-image area was measured. From laser output value corresponding to a line breadth (i.e., line width) of 24 $\mu$m: P (W), line breadth (i.e., line width) L: 24 $\mu$m, writing time: T (sec.), $T=D/(\sqrt{2}\cdot V)1$ (D: $1/e^2$ beam diameter (cm), V: scanning rate (cm/s)), irradiation energy I ($J/cm^2$)$=4\cdot P/(\pi D^2)\times T$ was obtained and this was taken as sensitivity.

Evaluation Method of Sensitivity and Results

The thus-prepared lithographic printing plate was observed with an optical microscope, as a result, fine line having a line breadth (i.e., line width) of 25 $\mu$m could be image-drawn. Sensitivity was obtained from the minimum laser output capable of image-drawing fine line having a line breadth of 24 $\mu$m. When output was 0.49 W, line breadth became 25 $\mu$m. Sensitivity was 740 $mJ/cm^2$.

Evaluation Method of Printing and Results

The lithographic printing plate on which an image was formed by laser beam irradiation was mounted on a printing press without performing post-treatment and printing was performed. Printing was performed with woodfree paper using Harris kiku-han monochromatic printing press (manufactured by Harris Co., Ltd.) as the printing press, Geos black (manufactured by Dainippon Chemicals & Ink Co., Ltd.) as the ink, and the mixture containing 90 vol % of Fountain Solution EU-3 (manufactured by Fuji Photo Film Co., Ltd.) diluted 100 times with water and 10 vol % of isopropanol as the fountain solution. As a result, the laser-irradiated area generated no staining and 3,000 sheets of clear printed matters in which ink adhered securely to non-irradiated area could be obtained.

Example 2

Preparation of Lithographic Printing Plate Precursor Support

An aluminum plate (Al), a metal support, having a thickness of 0.2 mm was dipped in sodium hydroxide (NaOH: 26 wt %, Al: 6.5 wt %, 70° C.) for about 5 seconds for degreasing treatment. Al was then dipped in an aqueous solution containing 30 wt % of sulfuric acid at 60° C. for 10 seconds for removing aluminum hydroxide formed on the surface at etching, and thoroughly dried. As a heat-insulating layer, PET having a thickness of 6.5 $\mu$m was adhered to Al having a thickness of 0.2 mm with an $\alpha$-cyanoacrylate adhesive (trade name: 3000DXF, manufactured by Cemedain Co., Ltd.). Subsequently, as a metal layer, Al foil (plate or sheet) having a thickness of 15 $\mu$m was adhered on the above PET with an $\alpha$-cyanoacrylate adhesive (trade name: 3000DXF, manufactured by Cemedain Co., Ltd.). As a result of measuring a thickness of Al support, Al foil (plate or sheet), PET and total layer at ten points with a micrometer, the thickness of the adhesive was calculated as $1\pm0.8$ $\mu$m. The thickness of the heat-insulating layer was 8.5 $\mu$m from the adding up of the adhesive thickness on Al foil (plate or sheet) side (1 $\mu$m), the PET thickness (6.5 $\mu$m), and the adhesive thickness on Al support side (1 $\mu$m). Alaminator (TOLAMI DX-700) was used in the adhesion.

Adjusting Method and Measuring Method of Metal Layer (Al Foil (Plate or Sheet)) Thickness A tape (NITTO Danpron Tape) for preventing dissolution-etching was stuck on the back side surface of the metal support. Dissolution-etching was performed with sodium hydroxide (NaOH: 26 wt %, Al: 6.5 wt %, 70° C.) and dipping time was adjusted so that the thickness of Al foil (plate or sheet) became 10 $\mu$m (31 seconds). Subsequently, Al foil (plate or sheet) was dipped in a 30 wt % aqueous solution of sulfuric acid at 60° C. for 10 seconds for removing aluminum hydroxide formed on the surface at etching. As a result of calculating the etching thickness from the change in weight of Al foil (plate or sheet) before and after etching, the etching thickness was 10 $\mu$m. The thicknesses of Al foil (plate or sheet) before and after etching were measured at ten points with a micrometer to calculate the thickness of Al foil (plate or sheet), the thickness of Al foil (plate or sheet) was 10 $\mu$m on average and the standard deviation was 0.8 $\mu$m. Further, for the sake of confirmation, a cross section was produced by a microtome and observed with an SEM. The average thicknesses was 10 $\mu$m and the standard deviation was 0.5 $\mu$m from the observation at ten points.

An ablation type image-recording layer was formed on the support prepared as described above in the same manner as in Example 1. The heat conductivity of the heat-insulating layer was measured in the same manner as in Example 1 and the same measured value was obtained. Further, laser irradiation for image exposure was also performed in the same manner as in Example 1.

Evaluation Method of Sensitivity and Results

The thus-prepared lithographic printing plate was observed with an optical microscope, as a result, fine line having a line breadth of 25 $\mu$m could be image-drawn. Sensitivity was obtained from the minimum laser output capable of image-drawing fine line having a line breadth of 25 $\mu$m. When maximum output was 0.724 W, line breadth was discontinuous but line could be drawn.

Evaluation Method of Printing and Results

The lithographic printing plate on which an image was formed by laser beam irradiation was mounted on a printing press without performing post-treatment and printing was performed. Printing was performed with woodfree paper using Harris kiku-han monochromatic printing press (manufactured by Harris Co., Ltd.) as the printing press, Geos black (manufactured by Dainippon Chemicals & Ink Co., Ltd.) as the ink, and the mixture containing 90 vol % of Fountain Solution EU-3 (manufactured by Fuji Photo Film Co., Ltd.) diluted 100 times with water and 10 vol % of isopropanol as the fountain solution. As a result, staining was observed on the laser-irradiated area but printed matters could be obtained.

Comparative Example 1

Preparation of Lithographic Printing Plate Precursor Support

The support of a lithographic printing plate precursor was formed in the same manner as in Example 2 except that the thickness of a metal layer (Al foil (plate or sheet)) was adjusted as follows.

Adjusting Method and Measuring Method of Metal Layer (Al Foil (Plate or Sheet)) Thickness A tape (NITTO Danpron Tape) for preventing dissolution-etching (NITTO danpron tape) was stuck on the back side surface of the metal support. Dissolution-etching was performed with sodium hydroxide (NaOH: 26 wt %, Al: 6.5 wt %, 70° C.) and dipping time was adjusted so that the thickness of Al foil (plate or sheet) became 14 μm (9 seconds). Subsequently, Al foil (plate or sheet) was dipped in a 30 wt % aqueous solution of sulfuric acid at 60° C. for 10 seconds for removing aluminum hydroxide formed on the surface at etching. As a result of calculating the etching thickness from the change in weight of Al foil (plate or sheet) before and after etching, the etching thickness was 14 μm. The thicknesses of Al foil (plate or sheet) before and after etching were measured at ten points with a micrometer to calculate the thickness of Al foil (plate or sheet), the thickness of Al foil (plate or sheet) was 14 μm on average and the standard deviation was 0.8 μm. Further, for the sake of confirmation, a cross section was produced by a microtome and observed with an SEM. The average thicknesses was 14 μm and the standard deviation was 0.5 μm from the observation at ten points.

An ablation type image-recording layer was formed on the support prepared as described above in the same manner as in Example 1. The heat conductivity of the heat-insulating layer was measured in the same manner as in Example 1 and the same measured value was obtained. Further, laser irradiation for image exposure was also performed in the same manner as in Example 1.

Evaluation Method of Sensitivity and Results

The thus-prepared lithographic printing plate was observed with an optical microscope, as a result, image-drawing could not be effected even with the maximum output of 0.724 W.

Comparative Example 2

Preparation of Lithographic Printing Plate Precursor Support

An aluminum plate (Al), a metal support, having a thickness of 0.2 mm was dipped in sodium hydroxide (NaOH: 26 wt %, Al: 6.5 wt %, 70° C.) for about 5 seconds for degreasing treatment. Al was then dipped in a 30 wt % aqueous solution of sulfuric acid at 60° C. for 10 seconds for removing aluminum hydroxide formed on the surface at etching, and thoroughly dried. As a heat-insulating layer, PET having a thickness of 6.5 μm was adhered to Al having a thickness of 0.2 mm with an α-cyanoacrylate adhesive (trade name: 3000DXF, manufactured by Cemedain Co., Ltd.). As a result of measuring a thickness of Al support, PET and total layer at ten points with a micrometer, the thickness of the adhesive was calculated as 1 μm on average and the standard deviation was 0. 8 μm. The thickness of the heat-insulating layer was 7.5 μm from the adding up of the PET thickness (6.5 μm and the adhesive thickness on the lowermost Al layer side (1 μm). A laminator (TOLAMI DX-700) was used in the adhesion.

An ablation type image-recording layer was formed on the support prepared as described above in the same manner as in Example 1. The heat conductivity of the heat-insulating layer was measured in the same manner as in Example 1 and the same measured value was obtained. Further, laser irradiation for image exposure was also performed in the same manner as in Example 1.

Evaluation Method of Sensitivity and Results

The thus-prepared lithographic printing plate was observed with an optical microscope, as a result, fine line having a line breadth of 25 μm could be image-drawn. Sensitivity was obtained from the minimum laser output capable of image-drawing fine line having a line breadth of 24 μm. When output was 0.278 W, line breadth became 25 μm. Sensitivity was 411 mJ/cm$^2$.

Evaluation Method of Printing and Results

The lithographic printing plate on which an image was formed by laser beam irradiation was mounted on a printing press without performing post-treatment and printing was performed. Printing was performed with woodfree paper using Harris kiku-han monochromatic printing press (manufactured by Harris Co., Ltd.) as the printing press, Geos black (manufactured by Dainippon Chemicals & Ink Co., Ltd.) as the ink, and the mixture containing 90 vol % of Fountain Solution EU-3 (manufactured by Fuji Photo Film Co., Ltd.) diluted 100 times with water and 10 vol % of isopropanol as the fountain solution. As a result, ink adhered all over the surface of the sheet and an image could not be formed.

Comparative Example 3

Preparation of Lithographic Printing Plate Precursor Support

Al having a thickness of 0.2 mm which had been undergone alkali degreasing treatment was cut into an appropriate size and used as the metal support.

An ablation type image-recording layer was formed on the support prepared as described above in the same manner as in Example 1. The heat conductivity of the aluminum plate having a thickness of 0.2 mm was measured with measuring instrument QTM-5000 (manufactured by Kyoto Denshi Kogyo Co., Ltd.). The result obtained was 234 [W/(m·K)]. Further, laser irradiation for image exposure was also performed in the same manner as in Example 1.

Evaluation Method of Sensitivity and Results

The thus-prepared lithographic printing plate was observed with an optical microscope, as a result, line image-drawing could not be effected even with the maximum output of 0.724 W.

Sensitivities and the results of printing in Examples 1 and 2 and Comparative Examples 1 to 3 are summarized in Table 1.

By the use of the lithographic printing plate precursors according to the present invention (Examples 1 and 2), clear printed matters having no staining could be obtained while maintaining high water resistance as that of metals and high sensitivity.

In particular, the lithographic printing plate precursor in Example 1 showed an appropriate heat retentivity under laser irradiation conditions according to the present invention, excellent water resistance and high sensitivity presumably due to the appropriate thickness of Al foil (plate or sheet) of the lithographic printing plate precursor support.

On the other hand, in Comparative Example 2 wherein the support of the lithographic printing plate precursor was not provided with Al foil (plate or sheet), although high sensitivity could be obtained, image turbulence occurred and printing could not be performed. Further, in Comparative Example 3 wherein aluminum alone was used as the support of the lithographic printing plate precursor, objective fine line could not be imaged. This was presumably because heat was conducted to aluminuim and sufficient ablation (i.e., sufficient fusion and removal) was not effected.

TABLE 1

| Example | | Maximum Laser Output | | | | |
|---|---|---|---|---|---|---|
| No. | Layer Constitution | 0.724 W | 0.490 W | 0.278 W | 0.194 W | Printing |
| Comparative Example 2 | Image-recording layer + PET + Al | 30 μm | 30 μm | 25 μm | Discontinuous | Impossible |
| Example 1 | Image-recording layer + 1 μm Al foil + PET + Al | 30 μm | 25 μm | Discontinuous | Discontinuous | Possible |
| Example 2 | Image-recording layer + 10 μm Al foil + PET + Al | Discontinuous | Impossible | | | Slightly difficult |
| Comparative Example 1 | Image-recording layer + 14 μm Al foil + PET + Al | Impossible | | | | — |
| Comparative Example 3 | Image-recording layer + Al | Impossible | | | | — |

Thermal Positive Type

Example 3

The support for a lithographic printing plate precursor was prepared in the same manner as in Example 1 and the thickness of Al foil (plate or sheet) was adjusted in the same manner as in Example 1.

Formation of Thermal Positive Type Image-recording Layer

The coating solution having the following prescription was coated on a support by an appropriate coating bar, and dried in an oven at 100° C. for 2 minutes, thereby a thermal positive type image-recording layer was formed. As a result of measuring the thicknesses before and after coating at ten points with a micrometer, the thickness of the image-recording layer (prescription B1) was 1.2±0.8 μm. The coating amount of the coating solution was 1.4 g/$m^2$ from the weight change before and after coating of the coating solution. Subsequently, the coating solution having the following prescription B2 was coated and dried in an oven at 100° C. for 2 minutes. As a result of measuring the thicknesses before and after coating at ten points with a micrometer, the thickness of the image-recording layer (prescription B2) was 1.8±0.8 μm. The coating amount of the coating solution was 2 g/$m^2$ from the weight change before and after coating of the image-recording layer (prescription B2) and specific gravity. The heat conductivity of the heat-insulating layer was measured in the same manner as in Example 1 and the same measured value was obtained.

Coating Solution (Prescription B1)

| | |
|---|---|
| Copolymer 1 (described later) | 0.75 g |
| Cyanine dye A | 0.04 g |
| p-Toluenesulfonic acid | 0.002 g |
| Tetrahydrophthalic anhydride | 0.05 g |
| A dye obtained by replacing the counter anion of Victoria Pure Blue BOH with 1-naphthalenesulfonic acid anion | 0.015 g |
| Fluorine surfactant (Megafac F-177, manufactured by Dainippon Chemicals & Ink Co., Ltd.) | 0.02 g |
| γ-Butyrolactone | 8 g |
| Methyl ethyl ketone | 7 g |
| 1-Methoxy-2-propanol | 7 g |

Coating Solution (Prescription B2)

| | |
|---|---|
| m-Cresol/p-cresol novolak resin (m/p ratio: 6/4, weight average molecular weight: 4,000) | 0.75 g |
| Cyanine dye A | 0.05 g |
| n-Dodecyl stearate | 0.02 g |
| Tetrahydrophthalic anhydride | 0.05 g |
| Fluorine surfactant (Megafac F-177, manufactured by Dainippon Chemicals & Ink Co., Ltd.) | 0.05 g |
| Methyl ethyl ketone | 7 g |
| 1-Methoxy-2-propanol | 7 g |

Synthesis Example 1

Synthesizing Method of Copolymer 1

Thirty-one point zero (31.0) grams (0.36 mol) of methacrylic acid, 39.1 g (0.36 mol) of ethyl chloroformate, and 200 ml of acetonitrile were added to a three necked flask having a capacity of 500 ml equipped with a stirrer, a cooling pipe and a dropping funnel, and the mixture was stirred with cooling in a ice water bath. To the mixture was dropwise added 36.4 g (0.36 mol) of triethylamine by means of a dropping funnel over about 1 hour. After termination of the dropwise addition, the ice water bath was taken out and the reaction mixture was stirred at room temperature for 30 minutes.

To this reaction mixture, 51.7 g (0.30 mol) of p-aminobenzenesulfonamide was added and the mixture was stirred at 70° C. in an oil bath for 1 hour. After completion of the reaction, the mixture was poured into 1 liter of water with stirring the water, and stirring of the mixture was continued for 30 minutes. The mixture was filtered and precipitated product was taken out, this precipitated product was made slurry with 500 ml of water. The slurry was filtered, and the obtained solid was dried, thereby white solid of N-(p-aminosulfonylphenyl)methacrylamide was obtained (yield: 46.9 g).

Five point zero four (5.04) grams (0.0210 mol) of N-(p-aminosulfonylphenyl)methacrylamide, 2.05 g (0.0180 mol) of ethylmethacrylate, 1.11 g (0.021 mol) of acrylonitrile, and20 g of N,N-dimethylacetamide were added to a three necked flask having a capacity of 100 ml equipped with a stirrer, a cooling pipe and a dropping funnel, and the mixture was stirred with heating at 65° C. in a hot water bath. To the mixture was added 0.15 g of V-65 (a product of Wako Pure Chemical Co., Ltd.) and the mixture was stirred in nitrogen atmosphere for 2 hours with maintaining the temperature at 65° C. After completion of the reaction, 40 g of methanol was added thereto and cooled. The mixture obtained was put in 2 liters of water with stirring the water and stirring was continued for 30 minutes. The precipitated product was recovered by filtration and dried, thereby 15 g of white solid was obtained. This copolymer 1 was found to have a weight average molecular weight (polystyrene standard) of 53,000 by gel permeation chromatography.

Laser Irradiation Conditions, Evaluation Method of Sensitivity and Results

The above-obtained lithographic printing plate precursor was subjected to exposure with an LD laser emitting infrared ray of wavelength of 830 nm (maximum laser output: 0.5 W). Irradiation conditions were: scanning rate: 500 cm/s, $1/e^2$ beam diameter D: 17 $\mu$m (as the beam profile showed good Gaussian distribution, approximation was conducted by Gaussian distribution and the position of $1/e^2$ laser output of the maximum strength of the peak was taken as beam diameter). After exposure, the printing plate precursor was subjected to development with an automatic processor PS Processor 900VR (manufactured by Fuji Photo Film Co., Ltd.) charged with a developing solution DP-4 and rinse solution FR-3 (1/7) (manufactured by Fuji Photo Film Co., Ltd.).

Writing was performed with varying laser output and line breadth at non-image area was measured after the above development processing. From laser output value corresponding to a line breadth of 12 $\mu$m: P (W), line breadth: L, $L=D/\sqrt{2}2$, writing time T (sec.), $T=D/(\sqrt{2}\cdot V)3$ (D: $1/e^2$ beam diameter (cm), V: scanning rate (cm/s)), irradiated energy I $(J/cm^2)=4\cdot P/(\pi D^2)\times T$ was obtained and this was taken as sensitivity.

Sensitivity at scanning rate of 500 cm/s was 100 $mJ/cm^2$ in the case of Example 3.

Evaluation Method of Printing and Results

The lithographic printing plate on which an image was formed by development after laser irradiation was mounted on a printing press without performing post-treatment and printing was performed. Printing was performed with woodfree paper using Harris kiku-han monochromatic printing press (manufactured by Harris Co., Ltd.) as the printing press, Geos black (manufactured by Dainippon Chemicals & Ink Co., Ltd.) as the ink, and the mixture containing 90 vol % of Fountain Solution EU-3 (manufactured by Fuji Photo Film Co., Ltd.) diluted 100 times with water and 10 vol % of isopropanol as the fountain solution. As a result, the laser-irradiated area generated no staining and 3,000 sheets of clear printed matters in which ink adhered securely to non-irradiated area could be obtained.

Comparative Example 4

Preparation of Lithographic Printing Plate Precursor Support

Al having a thickness of 0.2 mm which had been undergone alkali degreasing treatment was cut into an appropriate size and used as the lowermost metal layer. A thermal positive type image-recording layer was formed in the same manner as in Example 3. The heat conductivity measured in the same manner as in Comparative Example 3 was 237 [W/(m·K)].

Laser Irradiation Conditions, Evaluation Method of Sensitivity and Results

Laser irradiation and sensitivity evaluation were performed in the same manner as in Example 3. The sensitivity was 150 $mJ/cm^2$, which was inferior to the sensitivity in Example 3.

Evaluation Method of Printing and Results

The lithographic printing plate on which an image was formed by laser beam irradiation was mounted on a printing press without performing post-treatment and printing was performed. Printing was performed with woodfree paper using Harris kiku-han monochromatic printing press (manufactured by Harris Co., Ltd.) as the printing press, Geos black (manufactured by Dainippon Chemicals & Ink Co., Ltd.) as the ink, and the mixture containing 90 vol % of Fountain Solution EU-3 (manufactured by Fuji Photo Film Co., Ltd.) diluted 100 times with water and 10 vol % of isopropanol as the fountain solution. As a result, the non-irradiated area generated no staining and 3,000 sheets of clear printed matters in which ink adhered securely to laser-irradiated area could be obtained.

From the results in Example 3 and Comparative Example 4, due to the support of the lithographic printing plate precursor having the constitution according to the present invention, the sensitivity of the lithographic printing plate precursor could be markedly improved and clear printed matters could be obtained without modifying the composition of the positive type image-recording layer.

Thermal Negative Type

Example 4

The support for a lithographic printing plate precursor was prepared in the same manner as in Example 1 and the thickness of Al foil (plate or sheet) was adjusted in the same manner as in Example 1.

Formation of Thermal Negative Type Image-recording Layer

The coating solution having the following prescription C was coated on a support by an appropriate coating bar, and dried in an oven at 100° C. for 1 minute, thereby a thermal negative type image-recording layer was formed. As a result of measuring the thicknesses before and after coating at ten points with a micrometer, the thickness of the thermal negative type image-recording layer (prescription C) was 1.5 $\mu$m on average and the standard deviation was 0.8 $\mu$m. The thickness obtained from the weight change before and after coating of the coating solution and specific gravity was 1.7 $\mu$m. This was used as a lithographic printing plate precursor. The heat conductivity of the plate was measured in the same manner as in Example 1 and the same measured value was obtained.

Coating Solution (Prescription C)

| | |
|---|---|
| Compound which generates acid by light or heat shown below | 0.2 g |
| Crosslinking agent crosslinkable by acid shown below | 0.7 g |
| Binder (trade name: Maruka Linker MS-4P, manufactured by Maruzen Petrochemical Co., Ltd. | 1.5 g |
| Ultraviolet absorber NK-3508 (trade name, manufactured by Nihon Kanko Shikiso Kenkyu-sho Co., Ltd.) | 0.15 g |
| Other additives | |
| Victoria Pure Blue BO (C.I. 44040) | 0.05 g |
| Fluorine surfactant (Megafac F-177, manufactured by Dainippon Chemicals & Ink Co., Ltd.) | 0.06 g |

Solvent

| | |
|---|---|
| Methyl ethyl ketone | 15 g |
| 1-Methoxy-2-propanol | 5 g |
| Methyl alcohol | 7 g |

Compound Which Generates Acid by Light or Heat

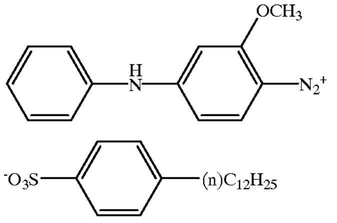

Crosslinking Agent Crosslinkable by Acid

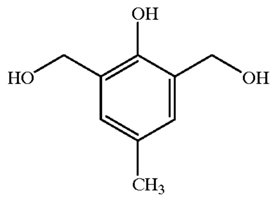

Laser Irradiation Conditions, Evaluation Method of Sensitivity and Results

Each of the above lithographic printing plate precursors was subjected to exposure with solid state continuous oscillation YAG laser emitting infrared ray of wavelength of 1,064 nm (maximum output: 0.724 W). Exposure was performed on the conditions of scanning rate of 120 cm/s, $1/e^2$ beam diameter D=35 $\mu$m (as the beam profile showed good Gaussian distribution, approximation was conducted by Gaussian distribution and the position of $1/e^2$ laser output of the maximum strength of the peak was taken as beam diameter). The lithographic printing plate precursor was heat-treated in an oven at 140° C. for 45 seconds. The heat-treated sample was then subjected to development using a commercially available automatic processor PS-900NP (manufactured by Fuji Photo Film Co., Ltd.) equipped with an immersion type developing tank. Developing tank of PS-900NP processor was charged with 20 liters of alkali development processing solution 1 (pH: about 13). The temperature of the alkali development processing solution 1 was maintained at 30° C.

Eight liters of city water was charged in the second bath of PS-900NP, and 8 liters of finishing gumming solution of FP-2W (manufactured by Fuji Photo Film Co., Ltd.) diluted with water in the ratio of 1/1 was charged in the third bath.

Composition of Alkali Development Processing Solution 1

| | |
|---|---|
| D-Sorbitol | 2.5 wt % |
| Sodium hydroxide | 0.85 wt % |
| Pentasodium diethylenetriaminepenta-(methylenephosphonate) | 0.05 wt % |
| Water | 96.6 wt % |

Writing was performed with varying laser output and line breadth at non-image area was measured. From laser output value corresponding to a line breadth of 24 $\mu$m: P (W), line breadth L: 24 $\mu$m, writing time: T (sec.), $T=D/\sqrt{2}\cdot V)4$ (D: $1/e^2$ beam diameter (cm), V: scanning rate (cm/s)), irradiation energy I $(J/cm^2)=4\cdot P/(\pi D^2)\times T$ was obtained and this was taken as sensitivity. Sensitivity at scanning rate of 120 cm/s was 100 $mJ/cm^2$.

Evaluation Method of Printing and Results

The lithographic printing plate on which an image was formed by development after laser irradiation was mounted on a printing press without performing post-treatment and printing was performed. Printing was performed with wood-free paper using Harris kiku-han monochromatic printing press (manufactured by Harris Co., Ltd.) as the printing press, Geos black (manufactured by Dainippon Chemicals & Ink Co., Ltd.) as the ink, and the mixture containing 90 vol % of Fountain Solution EU-3 (manufactured by Fuji Photo Film Co., Ltd.) diluted 100 times with water and 10 vol % of isopropanol as the fountain solution. As a result, the laser-irradiated area generated no staining and 3,000 sheets of clear printed matters in which ink adhered securely to non-irradiated area could be obtained.

Comparative Example 5

Preparation of Lithographic Printing Plate Precursor Support

Al having a thickness of 0.2 mm which had been undergone alkali degreasing treatment was cut into an appropriate size and used as the lowermost metal layer. A thermal negative type image-recording layer was formed in the same manner as in Example 4. The heat conductivity was measured in the same manner as in Comparative Example 4 and the same measured value as that in Comparative Example 4 was obtained.

Laser Irradiation Conditions, Evaluation Method of Sensitivity and Results

Laser irradiation and sensitivity evaluation were performed in the same manner as in Example 4. The sensitivity was 150 $mJ/cm^2$, which was inferior to the sensitivity in Example 4.

Evaluation Method of Printing and Results

Printing was performed in the same manner as in Example 4 and the results obtained were the same as those in Example 4.

From the results in Example 4 and Comparative Example 5, due to the support of the lithographic printing plate precursor having the constitution according to the present invention, the sensitivity of the lithographic printing plate precursor could be markedly improved and clear printed matters having no staining could be obtained without modifying the composition of the negative type image-recording layer.

Effect of the Invention

According to the lithographic printing plate precursor of the present invention, the heat given to the inside of the lipophilic image-recording layer can be effectively used in image-forming in heat-sensitive image-recording, as a result, high sensitivity and clear printed matters having no staining can be obtained, these characteristics are attributable to the constitution of the lithographic printing plate precursor comprising a metal support having provided thereon a heat-insulating layer and a metal layer having a hydrophilic surface in this order from the support. Further, due to high dimensional stability of the metal support, the image-recording can be accurately reproduced even if water and a solvent are used in development process. Thus, the present invention can provide a lithographic printing plate precursor which can cope with four color printing.

While the invention has been described in detail and with reference to specific examples thereof, it will be apparent to one skilled in the art that various changes and modifications can be made therein without departing from the spirit and scope thereof.

What is claimed is:

1. A lithographic printing plate precursor which comprises a metal support having provided thereon a heat-insulating layer, a metal layer having a hydrophilic surface, and a lipophilic layer which is abraded by heating or whose solubility to alkali is transformed by heating, in this order from the support.

2. The lithographic printing plate precursor as in claim 1, wherein said heat-insulating layer has a heat conductivity of 40 W/(m·K) or less.

3. The lithographic printing plate precursor as in claim 1, wherein said metal layer has a film thickness of from 1 $\mu$m or 10 $\mu$m.

4. The lithographic printing plate precursor as in claim 1, wherein said metal support is an aluminum plate.

* * * * *